US006510536B1

(12) United States Patent
Crozier et al.

(10) Patent No.: US 6,510,536 B1
(45) Date of Patent: Jan. 21, 2003

(54) REDUCED-COMPLEXITY MAX-LOG-APP DECODERS AND RELATED TURBO DECODERS

(75) Inventors: Stewart N. Crozier, Groton, MA (US); Ken Gracie, Ottawa (CA); Andrew Hunt, Ottawa (CA); John Lodge, Kanata (CA); Paul Guinand, Fitzroy Harbour (CA)

(73) Assignee: Her Majesty the Queen in right of Canada, as represented by the Minister of Industry through the Communications Research Centre (CA)

( * ) Notice: Subject to any disclaimer, the term of this patent is extended or adjusted under 35 U.S.C. 154(b) by 0 days.

(21) Appl. No.: 09/324,429

(22) Filed: Jun. 1, 1999

Related U.S. Application Data
(60) Provisional application No. 60/087,591, filed on Jun. 1, 1998.

(51) Int. Cl.$^7$ ........................ H03M 13/41; H03M 13/45
(52) U.S. Cl. ........................ 714/755; 714/794; 714/795
(58) Field of Search ............................... 714/755, 794, 714/795

(56) References Cited

U.S. PATENT DOCUMENTS

| | | | |
|---|---|---|---|
| 5,056,105 A | | 10/1991 | Darmon et al. |
| 5,446,747 A | | 8/1995 | Berrou |
| 5,719,875 A | | 2/1998 | Wei |
| 5,764,649 A | | 6/1998 | Tong |
| 5,933,462 A | * | 8/1999 | Viterbi et al. ................ 375/341 |
| 6,023,783 A | * | 2/2000 | Divsalar et al. ............ 714/792 |
| 6,028,899 A | * | 2/2000 | Petersen ...................... 375/341 |

FOREIGN PATENT DOCUMENTS

| | | | |
|---|---|---|---|
| GB | 2317 789 A | 9/1996 | |
| WO | WO 96/13105 | 10/1995 | |
| WO | WO 98/20617 | 11/1997 | |

OTHER PUBLICATIONS

Hagenauer et al., "A Viterbi Algorithm with Soft–Decision Outputs and its Applications", GLOBECOM '89, pp. 1680–1686.*

Joeressen et al., "Systematic Design Optimization of a Competitive Soft–Concatenated Decoding System", 1993 Workshop on VLSI Signal Processing, pp. 105–113.*

Siala et al., "An Iterative Decoding Scheme for Serially Concatenated Convolutional Codes", 1995 International Symposium on Information Theory, p. 473.*

Benedetto et al., "Soft–Output Decoding Algorithms in Iterative Decoding of Turbo Codes", TDA Progress Report 42–124, Feb. 1996, pp. 63–87.*

Benedetto et al., "A Soft–Output Maximum A Posteriori (MAP) Module to Decode Parallel and Serial Concatenated Codes", TDA Progress Report 42–127, Nov. 1996, pp. 1–20.*

(List continued on next page.)

*Primary Examiner*—Stephen M. Baker
(74) *Attorney, Agent, or Firm*—Polster, Lieder, Woodruff & Lucchesi, L.C.

(57) ABSTRACT

Methods of reduced-complexity max-log-APP processing are disclosed for use with Turbo and Turbo-like decoders. The invented methods of decoding are derived from max-log-APP processing and significantly lower the processing required for decoding convolutional codes by eliminating a portion of the calculations conventionally associated with max-log-APP processing. The disclosed embodiments provide simplified methods of metric combining based on determining the bits of an MLSE sequence with different alternative approaches. Also disclosed is an early stopping method that uses the reduced-complexity max-log-APP decoder to reduce the average number of decoding operations required by an iterative Turbo decoder.

35 Claims, 9 Drawing Sheets

OTHER PUBLICATIONS

Benedetto et al., "Analysis, Design, and Iterative Decoding of Double Serially Concatenated Codes with Interleavers", IEEE Journal on Selected Araeas in Communications, vol. 16, No. 2, Feb. 1998, pp. 231–244.*

Viterbi, "An Intuitive Justification and a Simplified Implementation of the MAP Decoder for Convolutional Codes", IEEE Jurnal on Selected Areas in Communications, vol. 16, No. 2, Feb. 1998, pp. 260–264.*

Hsu et al., "A Parallel Decoding Scheme for Turbo Codes", ISCAS '98, pp. IV–445–IV–448.*

C. Berrou, A. Glavieux, and P. Thitimajshima; "Near Shannon Limit Error–Correcting Coding and Decoding Turbo–Codes"; The Proceedings of ICC 1993. Geneva, Switzerland, May 1993; pp 1064–1070.

C. Berrou, and A. Glavieux; "Near Optimum Error Correcting Coding and Decoding: Turbo Codes"; IEEE Trans. On Comm., vol. 44, No. 10, Oct. 1996.

L. Bahl, J. Cocke, F. Jelinek, and J. Raviv; "Optimal Decoding of Linear Codes for Minimizing Symbol Error Rate"; IEEE Trans. On Inform. Theory, vol. IT–20, Mar. 1974, pp 284–287.

R. Gallager, "Low–Density Parity–Check Codes", IRE Trans. on Inform. Theory, pp. 21–28, Jan. 1962.

G. Battail, "Building Long Codes by Combination of Simple Ones, Thanks to Weighted–Output Decoding", in Proc., URSI ISSSE, Erlangen, Germany, pp. 634–637, Sep. 1989.

J. Lodge, P. Hoeher, and J. Hagenauer, "The Decoding of Multi–Dimensional Codes using Separable MAP 'filters'," in Proc. 16th Biennial Symp. On Communications, Queen's University, Kingston, Canada, pp. 343–346, May 1992.

J. Lodge, P. Hoeher, and J. Hagenauer, "Separable MAP 'filters' for the Decoding of Product and Concatenated Codes," in Proc. IEEE Int. Conf. On Communications, Geneva, Switzerland, pp. 1740–1745, May 1993.

A. Hunt, "Hyper–Codes: High–Performance Low–Complexity Error correcting Codes", Carleton University, Master's Thesis, to be submitted in Feb. 1998.

A. Viterbi, "Error Bounds for Convolutional Codes and an Asymptotically optimum Decoding Algorithm", IEEE Trans. Inform. Theory, vol. IT–13, pp. 260–269, Apr. 1967.

G. Forney, "The Viterbi Algorithm", Proc. IEEE, vol. 61, No. 3, pp. 268–278, Mar. 1973.

P. Robertson, E. Villebrun, and P. Hoeher, "A Comparison of Optimal and Sub–Optimal MAP Decoding Algorithms Operating in the Log Domain", Proceedings of ICC'95, Seattle, pp. 1009–1013, Jun. 1995.

P. Robertson, P. Hoeher, and E. Villebrun, "Optimal and Sub–Optimal Maximum a Posteriori Algorithms Suitable for Turbo Decoding", IEEE Communications Theory, vol. 8, No. 2, Mar.–Apr. 1997.

S. Pietrobon, "Implementation and Performance of a Turbo/MAP Decoder", submitted to the International Journal of Satellite Communications, Feb. 21 1997.

J. Hagenauer, E. Offer, and L. Papke, "Iterative Decoding of Binary Block and Convolutional Codes", IEEE Trans. on Inform Theory, vol. 42, No. 2, pp. 429–445, Mar. 1996.

J. Erfanian, S. Pasupathy, G. Gulak, "Reduced Complexity Symbol Detectors with Parallel Structures for ISI Channels", IEEE Trans. on Communications, vol. 42, No. 2/3/4, pp. 1661–1671, Feb./Mar./Apr. 1994.

B. Talibart and C. Berrou, "Notice Preliminaire du Circuit Turbo–Codeur/Decodeur TURBO4", Version 0.0, Jun., 1995.

S. Crozier, A. Hunt, K. Gracie and J. Lodge; "Performance and Complexity Comparision of Block Turbo–Codes, Hyper–Codes, and Tail–Biting Convolutional Codes", $19^{th}$ Biennial Symposium on Communications, Kingston, Ontario, Canada, pp. 84–88, May 31–Jun. 3, 1998.

* cited by examiner

REDUCED-COMPLEXITY MAX-LOG-APP DECODERS AND RELATED TURBO DECODERS

Application Provisional claims benefit of No. 60/087,591 filed Jun. 1, 1998.

FIELD OF THE INVENTION

This invention relates to max-log-APP decoding and is particularly concerned with max-log-APP decoder systems and methods suited for Turbo and Turbo-like forward-error-correcting codes, by using iterative processing.

BACKGROUND OF THE INVENTION

Claude Berrou obtained U.S. Pat. No. 4,446,747 entitled: "Error-correction coding method with at least two systematic convolutional codings in parallel, corresponding iterative decoding method, decoding module and decoder". This patent describes essentially the same Turbo-code presented by Berrou et al in their paper "Near Shannon Limit Error-Correcting Coding and Decoding: Turbo-Codes", published in the Proceedings of ICC'93, Geneva, Switzerland, pp. 1064–1070, May, 1993. The Turbo-code presented, is a rate 1/2 binary code that provided performance within 0.5 dB of the BPSK capacity limit at a BER of $10^{-5}$, when using an interleaver block size of 65,536. This result is also only 0.7 dB from the more general Shannon capacity limit. The encoder consists of two rate 1/2 recursive systematic convolutional (RSC) encoders operating in parallel with the data binary digits (bits) interleaved between the two encoders as shown in FIG. 1. Without puncturing, and with rate 1/2 constituent codes, the overall code rate is 1/3. This is because the systematic data bits only need to be sent once. Other code rates can be achieved as required by puncturing the parity bits $c^1_i$ and $c^2_i$. In this configuration, the job of the interleaver is to spread reliability information that occurs in one code throughout the other code so that there is a higher probability of correcting unreliable information. FIG. 2 shows the RSC encoder, with polynomials $(23,35)_8$, used in the prior art TURBO4 codec as discussed in B. Talibart and C. Berrou, "Notice Preliminaire du Circuit Turbo-Codeur/Decodeur TURBO4", Version 0.0, June, 1995. This RSC encoder has four memory (delay) units.

More recently Berrou, and Glavieux provided more discussion of the coding and decoding of Turbo-codes in their paper "Near Optimum Error Correcting Coding and Decoding: Turbo-Codes", published in the IEEE Trans. on Comm., Vol. 44, No. 10, October 1996.

Soft-in/soft-out a posterior probability (APP) decoding of the systematic component codes is key to the decoding of Turbo-codes. This is also referred to as maximum a posterior (MAP) decoding in the literature. The so-called MAP algorithm was first derived by Bahl et al in their paper "Optimal Decoding of Linear Codes for Minimizing Symbol Error Rate", published in IEEE Trans. on Inform. Theory, Vol. IT-20, pp. 284–287, March 1974. The APP terminology is more correct in the context of soft-in/soft-out iterative processing, and this is the terminology used here.

An APP decoder finds the probability of each data bit at each bit time given the entire received signal. Thus it also inherently provides the most likely bit value at each bit time given the entire received signal. This is in contrast to the well-known Viterbi algorithm, which performs maximum likelihood sequence estimation (MLSE) as discussed in A. Viterbi, "Error Bounds for Convolutional Codes and an Asymptotically optimum Decoding Algorithm", IEEE Trans. Inform. Theory, Vol. IT-13, pp. 260–269, April 1967; and G. Forney, "The Viterbi Algorithm", Proc. IEEE, Vol. 61, No. 3, pp. 268–278, March 1973. That is, the Viterbi algorithm finds the entire sequence that was most likely transmitted given the received signal. Both algorithms are optimum for their respective criteria, but the APP decoding approach more naturally provides the soft information required for iterative decoding. The relationship between these two decoding methods will be further explained below.

The following is a brief summary of the relevant background material required for understanding the invention. The APP, log-APP, and max-log-APP decoding algorithms are described. A more detailed description of these prior art algorithms is provided in, for example, L. Bahl, J. Cocke, F. Jelinek, and J. Raviv, "Optimal Decoding of Linear Codes for Minimizing Symbol Error Rate", IEEE Trans. on Inform. Theory, Vol. IT-20, pp. 284–287, March 1974; P. Robertson, E. Villebrun, and P. Hoeher, "A Comparison of Optimal and Sub-Optimal MAP Decoding Algorithms Operating in the Log Domain", Proceedings of ICC'95, Seattle, pp. 1009–1013, June 1995; P. Robertson, P. Hoeher, and E. Villebrun, "Optimal and Sub-Optimal Maximum a Posteriori Algorithms Suitable for Turbo Decoding", IEEE Communications Theory, Vol. 8, No. 2, pp. 119–125, March–April 1997. S. Pietrobon, "Implementation and Performance of a Turbo/MAP Decoder", submitted to the International Journal of Satellite Communications, Feb. 21, 1997; J. Hagenauer, E. Offer, and L. Papke, "Iterative Decoding of Binary Block and Convolutional Codes", IEEE Trans. on Inform Theory, Vol. 42, No. 2, pp. 429–445, March 1996; J. Erfanian, S. Pasupathy, G. Gulak, "Reduced Complexity Symbol Detectors with Parallel Structures for ISI Channels", IEEE Trans. on Communications, Vol. 42, No. 2/3/4, pp.1661–1671, February/March/April 1994.

The decoding algorithms are presented in the context of systematic binary convolutional codes and an additive white Gaussian noise (AWGN) channel model. Of course this does not prevent their use in other systems with more complicated signaling constellations and channels. In the case of Turbo-codes, recursive systematic convolutional (RSC) codes are conventionally employed.

The prior art APP decoding algorithm is now described. The data bit at time i is denoted as $d_i$ and is either 0 or 1. The state of the RSC encoder at time i is determined by the contents of the encoder's shift-register before $d_i$ enters the encoder. Thus, data bit $d_i$ causes the state of the encoder to change from $S_i$ to $S_{i+1}$. The initial state $S_1$ is usually set to zero. Here it is assumed that after K systematic bits the final state, $S_{K+1}$, is also zero. In the case of RSC codes the last mem systematic bits are often reserved and specifically chosen to flush or terminate the encoder into the zero state, where mem is the memory of the RSC encoder. The number of states is $N_s=2^{mem}$. The usual approach with Turbo-codes is to terminate the first RSC code, interleave the data and flush bits, and then leave the second RSC code unterminated.

Assuming a rate 1/2 RSC encoder, as shown in FIG. 2 for example, the outputs at time i are the systematic data bit $d_i$ and the coded parity bit $c_i$. These outputs are typically modulated using an antipodal signaling scheme such as BPSK or QPSK and sent through an additive white Gaussian noise (AWGN) channel. The received sequence is defined as $$R = [x_1 y_1 \ldots x_i y_i \ldots x_K y_K] \tag{1}$$

where $(x_i, y_i)$ is a pair of received signal samples at time i, and $$x_i = d_i' + u_i, \quad d_i' = 1 - 2d_i \quad (2)$$

$$y_i = c_i' + v_i, \quad c_i' = 1 - 2c_i \quad (3)$$

where $d_i'$ and $c_i'$ are the corresponding data and parity symbols with ±1 values, and $u_i$ and $v_i$ are AWGN samples with variance $\sigma^2$. The likelihood ratio associated with each data bit at time i is given by $$\lambda_i = \frac{\Pr(d_i = 0 \mid R)}{\Pr(d_i = 1 \mid R)} \quad (4)$$

where $\Pr(d_i = d \mid R)$, $d = 0, 1$ is the a posterior probability (APP) of the data bit $d_i$. Once $\lambda_i$ is evaluated, decisions can be made as follows $$\hat{d}_i = \begin{cases} 0 & \text{if } \lambda_i \geq 1 \\ 1 & \text{if } \lambda_i < 1 \end{cases} \quad (5)$$

The efficient method of calculating $\lambda_i$ can be summarized as follows:

$$\lambda_i = \frac{\sum_{m=0}^{N_s-1} \alpha_i^m \delta_i^{0,m} \beta_{i+1}^{f(0,m)}}{\sum_{m=0}^{N_s-1} \alpha_i^m \delta_i^{1,m} \beta_{i+1}^{f(1,m)}} \quad (6)$$

where m is the state number and the summations are over all $N_s$ states. The $\alpha$'s and $\beta$'s are the forward and backward state metrics, respectively, and the $\delta$'s are the branch metrics. The notation $f(d,m)$ refers to the next forward state given input data bit d and current state m. Similarly, the notation $b(d,m)$ refers to the next backward state given input d. The forward state metrics are updated recursively using $$\alpha_i^m = \sum_{d=0}^{1} \alpha_{i-1}^{b(d,m)} \delta_{i-1}^{d,b(d,m)} \quad (7)$$

The backward state metrics are updated recursively using $$\beta_i^m = \sum_{d=0}^{1} \delta_i^{d,m} \beta_{i+1}^{f(d,m)} \quad (8)$$

Given the assumed signal and channel model, and assuming no a priori information about the bits (a priori information can easily be incorporated if desired), the branch metrics are given by $$\delta_i^{d,m} = K_i \exp(-L_c(x_i d + y_i c^{d,m})) \quad (9)$$

or, $$\delta_i^{d,m} = K_i' \exp(L_c/2(x_i d' + y_i c'^{d,m})) \quad (10)$$

where $K_i$ and $K_i'$ are constants independent of the data and coded bits, $L_c = 2/\sigma^2 = 4E_s/N_0$ is called the reliability value of the channel, and $c^{d,m}$ is the coded bit given input bit d with the encoder in state m. Recall that d' and c' are the corresponding ±1 transmission symbols as defined in (2) and (3). Constants $K_i$ and $K_i'$ can be ignored or used to normalize the state metrics since they cancel in (6).

Substituting (9) or (10) into (6) gives $$\lambda_i = \exp(L_c x_i) \zeta_i \quad (11)$$

where $$\zeta_i = \frac{\sum_{m=0}^{N_s-1} \alpha_i^m \exp(-L_c y_i c^{0,m}) \beta_{i+1}^{f(0,m)}}{\sum_{m=0}^{N_s-1} \alpha_i^m \exp(-L_c y_i c^{1,m}) \beta_{i+1}^{f(1,m)}} \quad (12)$$

is the extrinsic information factor, used to correct the original systematic information to minimize the probability of decoding error.

The APP decoding algorithm is implemented by first calculating the $\alpha$'s in the forward direction and storing the results. The $\beta$'s are then calculated in the reverse direction. The $\lambda$'s can be calculated at the same time as the $\beta$'s to reduce the memory requirement for the $\beta$'s and to reduce the number of operations required for the $\lambda$'s by reusing intermediate $\beta$ calculations. It is clear from (6) and (8) what products can be reused. If the encoder starts in the zero state then we initialize $\alpha_1^0 = 1$ and $\alpha_1^m = 0$ for $m \neq 0$. If the encoder ends in the zero state then we initialize $\beta_{K+1}^0 1$ and $\beta_{K+1}^m = 0$ for $m \neq 0$. If the encoder ends in an unknown state then it is appropriate to initialize all $\beta$'s to 1, or some other non-zero value.

The log-APP decoding algorithm is now described. Converting to the log domain we define $$L_i = \ln(\lambda_i) \quad (13)$$

$$A_i^m = \ln(\alpha_i^m) \quad (14)$$

$$B_i^m = \ln(\beta_i^m) \quad (15)$$

$$D_i^{d,m} = \ln(\delta_i^{d,m}) \quad (16)$$

The following operation can also be defined, using the well-known Jacobi's logarithm function, as described in P. Robertson, E. Villebrun, and P. Hoeher, "A Comparison of Optimal and Sub-Optimal MAP Decoding Algorithms Operating in the Log Domain", Proceedings of ICC'95, Seattle, pp. 1009–1013, June 1995; P. Robertson, P. Hoeher, and E. Villebrun, "Optimal and Sub-Optimal Maximum a Posteriori Algorithms Suitable for Turbo Decoding", IEEE Communications Theory, Vol. 8, No. 2, pp. 119–125, March–April 1997; S. Pietrobon, "Implementation and Performance of a Turbo/MAP Decoder", submitted to the International Journal of Satellite Communications, Feb. 21, 1997; J. Hagenauer, E. Offer, and L. Papke, "Iterative Decoding of Binary Block and Convolutional Codes", IEEE Trans. on Inform Theory, Vol. 42, No. 2, pp. 429–445, March 1996; J. Erfanian, S. Pasupathy, G. Gulak, "Reduced Complexity Symbol Detectors with Parallel Structures for ISI Channels", IEEE Trans. on Communications, Vol. 42, No. 2/3/4, pp.1661–1671, February/March/April 1994.

$$a \, \mathrm{J} \, b = \ln(e^a + e^b) = \max(a,b) + f(a-b) \quad (17)$$

where $$f(x) = \ln(1 + e^{-|x|}) \quad (18)$$

The function $f(x)$ can be easily implemented in a small single-parameter lookup table. It has been found that a table size of 16 or more, spanning an input range from 0 to 8, typically results in negligible degradation for Turbo decoding. By extension, the following operation is also defined:

$$\underset{n=1}{\overset{N}{J}} x_n = x_1 J x_2 J \cdots J x_N \qquad (19)$$

With these definitions and tools, the APP algorithm becomes:

$$L_i = \underset{m=0}{\overset{N_s-1}{J}} A_i^m + D_i^{0,m} + B_{i+1}^{f(0,m)} - \underset{m=0}{\overset{N_s-1}{J}} A_i^m + D_i^{1,m} + B_{i+1}^{f(1,m)} \qquad (20)$$

$$A_i^m = \underset{d=0}{\overset{1}{J}} A_{i-1}^{b(d,m)} + D_{i-1}^{d,b(d,m)} \qquad (21)$$

$$B_i^m = \underset{d=0}{\overset{1}{J}} D_i^{d,m} + B_{i+1}^{f(d,m)} \qquad (22)$$

where the branch metrics are now given by $$D_i^{d,m} = C_i - L_c(x_i d + y_i c^{d,m}) \qquad (23)$$

or, $$D_i^{d,m} = C_i' + L_c/2(x_i d' + y_i c'^{d,m}) \qquad (24)$$

Again, the constants $C_i$ and $C'_i$ can be ignored or used to normalize the state metrics since they cancel in (20).

Similar to (11), the log likelihood ratios (LLR's) can now be expressed as $$L_i = L_c x_i + z_i \qquad (25)$$

where $z_i = \ln(\zeta_i)$ is the extrinsic information in the log domain.

The order of operations for the log-APP algorithm is similar to that for the APP algorithm. The initialization is modified as follows. If the encoder starts in the zero state then initialize $A_1^0 = 0$ and $A_1^m = -$big for $m \neq 0$, where big is a number large enough to guarantee that state 0 wins. If the encoder ends in the zero state then initialize $B_{K+1}^0 = 0$ and $B_{K+1}^m = -$big for $m \neq 0$. If the encoder ends in an unknown state then it is appropriate to initialize all β's to 0, or some other single value.

The max-log-APP decoding algorithm is now described. The max-log-APP algorithm is obtained by letting f(x)=0 in (18). With this simplification, equations (20) to (22) become $$L_i = \max_m [A_i^m + D_i^{0,m} + B_{i+1}^{f(0,m)}] - \max_m [A_i^m + D_i^{1,m} + B_{i+1}^{f(1,m)}] \qquad (26)$$

$$A_i^m = \max[A_{i-1}^{b(0,m)} + D_{i-1}^{0,b(0,m)}, A_{i-1}^{b(1,m)} + D_{i-1}^{1,b(1,m)}] \qquad (27)$$

$$B_i^m = \max[D_i^{0,m} + B_{i+1}^{f(0,m)}, D_i^{1,m} + B_{i+1}^{f(1,m)}] \qquad (28)$$

The branch metrics are again given by (23) or (24).

A number of important observations can be made about the max-log-APP algorithm. First, it is independent of the noise variance, and thus any scale factors, when computing the branch metrics. Thus, letting $L_c=1$ in (23) and (24), and dropping the normalization constants which are to be understood, the branch metrics can be reduced to simply $$D_i^{d,m} = x_i d - y_i c^{d,m} \qquad (29)$$

or $$D_i^{d,m} = \frac{1}{2}(x_i d' + y_i c'^{d,m}) \qquad (30)$$

Recall that d' and c' are the ±1 transmission symbols corresponding to d and c, as defined in (2) and (3). The factor of ½ could also be dropped in (30) if the max-log-APP decoding algorithm is only used once. When used iteratively in a Turbo decoder however, it is important that the output LLR's be scaled appropriately for reusing the parity channel samples, $\{y_i\}$, which do not get improved or rescaled.

Another useful observation is that the A's are calculated in the same way that a Viterbi algorithm calculates its state metrics, given all past channel samples. The B's are also calculated using the metric portion of a Viterbi algorithm, but going backwards in time using all future samples. When these forward and backward state metrics are combined in (26), along with the branch metrics for the current bit, it is apparent that the max-log-APP algorithm finds the same MLSE sequence as the Viterbi algorithm (given sufficient history depth for all paths to merge). This has also already been noted in P. Robertson, P. Hoeher, and E. Villebrun, "Optimal and Sub-Optimal Maximum a Posteriori Algorithms Suitable for Turbo Decoding", IEEE Communications Theory, Vol. 8, No. 2, pp. 119–125, March–April 1997 and S. Pietrobon, "Implementation and Performance of a Turbo/MAP Decoder", submitted to the International Journal of Satellite Communications, Feb. 21, 1997. One of the differences between the Viterbi algorithm and the max-log-APP algorithm is that the max-log-APP algorithm does not need to keep track of state histories, but requires both forward and backward state metrics. That is, the max-log-APP algorithm does not require the history portion of a Viterbi algorithm. Another important difference is that the Viterbi algorithm does not output soft information about each decision. Although the max-log-APP algorithm does output soft information, it is still suboptimum compared to the information provided by the APP or log-APP algorithms.

FIG. 3 shows a prior art approach to Turbo decoding based on the log-APP decoding algorithm. The Turbo decoder uses an iterative process where the de-interleaved output vector of the second log-APP decoder, $L^2$, is fed back to the input of the first log-APP decoder after the first iteration. The first iteration uses the channel sample vector, X, corresponding to the systematic bits. These samples must be scaled by the channel reliability factor, $L_c$, if true log-APP decoding is to be performed. The channel sample vectors $Y^1$ and $Y^2$, corresponding to the parity bits from RSC encoders 1 and 2, are never updated and are used in every iteration. These channel samples must also be scaled by $L_c$ for true log-APP decoding.

The extrinsic information vector, $L_{ex}$, associated with a particular log-APP decoder is defined as the output, $L_{out}$, minus the input, $L_{in}$. This extrinsic information is saved (delayed) and subtracted off the input to the same log-APP decoder on the next iteration. It is well known that this operation generally improves performance and speeds up the convergence of the Turbo decoder. On the first iteration there is no extrinsic information to be subtracted off, thus this operation can be avoided.

The vector that is input to the second log-APP decoder must be interleaved using the same interleaver that was used in the Turbo-code encoder. Likewise, the output from the second log-APP decoder must be de-interleaved before being fed back to the input of the first log-APP decoder. Decisions can be made either at the output of the first log-APP decoder or the de-interleaved output of the second log-APP decoder. It is convention that one Turbo decoding iteration be defined as two log-APP decoding operations as shown in FIG. 3. To avoid confusion we will generally refer to the number of individual decoding operations, rather than the number of iterations.

FIG. 4 shows a modified Turbo decoder. This approach was briefly described in S. Crozier, A. Hunt, K. Gracie, and J. Lodge, "Performance and Complexity Comparison of Block Turbo-Codes, Hyper-Codes, and Tail-Biting Convolutional Codes", 19-th Biennial Symposium on Communications, Kingston, Ontario, Canada, pp.84–88, May 31–Jun. 3, 1998 and is also described in a co-pending U.S. patent application No. 60/055,611 filed Aug. 14, 1997. It is similar to the block diagram shown in FIG. 3 for the standard approach to Turbo decoding. One important difference is the use of the lower-complexity max-log-APP decoder, instead of the log-APP decoder, as the component decoder. The max-log-APP decoder is insensitive to scale factors. Thus the systematic and parity channel sample vectors, X, $Y^1$ and $Y^2$, no longer need to be scaled by the channel reliability factor, $L_c$, and this factor no longer needs to be estimated. Another important difference is the correction of both the total output, $L_{out}$, and the extrinsic information, $L_{ex}$, generated by each max-log-APP decoder.

It has been observed that the extrinsic information generated by the max-log-APP decoder is too optimistic. That is, the magnitude of the extrinsic information generated by the max-log-APP decoder is larger, on average, than that generated by the log-APP decoder. This average magnitude bias is easily corrected using a simple scale factor (SF). The corrected output and corrected extrinsic information vectors are calculated as follows:

$$L_{ex}^n = (L_{out}^n - L_{in}^n) \times SF, \ n=1,2 \quad (31)$$

$$L_{cor}^n = L_{in}^n + L_{ex}^n, \ n=1,2 \quad (32)$$

where n is the max-log-APP decoder number. The best SF is a function of the signal-to-noise ratio (SNR), the block size, the puncture rate, and the Turbo decoder iteration number. In practice it has been found that $SF \geq 5/8$ works well for almost all block sizes, SNRs, and iteration numbers, of practical interest. The improvement over using no scale factor, that is SF=1, depends on the SNR and other parameters, but is typically about 0.3 dB. The degradation from true log-APP decoding is typically within 0.1 or 0.2 dB, depending on the operating point.

The corrected extrinsic information, as calculated in (31), is saved (delayed) and subtracted off the input to the same max-log-APP decoder on the next iteration. As for the original Turbo decoder, the input vector to the second max-log-APP decoder must be interleaved using the same interleaver used in the Turbo-code encoder. Likewise, the corrected output from the second max-log-APP decoder must be de-interleaved before being fed back to the input of the first max-log-APP decoder.

SUMMARY OF THE INVENTION

It is an object of the present invention to obviate or mitigate at least one disadvantage of previous systems and methods for Turbo decoding.

It is an object of this invention to provide a reduced-complexity method for max-log-APP processing for use in Turbo and Turbo-like decoders.

It is another object of this invention to provide methods of Turbo decoding with lower processing required for decoding systematic convolutional codes by eliminating a portion of the calculations conventionally associated with max-log-APP processing, without substantially reducing the overall decoder performance.

It is yet another object of the invention to provide an early stopping method that uses the reduced complexity max-log-APP decoder to reduce the average number of decoding operations required by an iterative Turbo decoder.

A first aspect of the present invention provides a method of max-log-APP decoding of a sequence of samples representing a transmitted sequence of symbols obtained from encoding a data sequence of bits, each having a bit time i, with a binary convolutional encoding method having $N_s$ states and an encoding trellis, said decoding method comprising the seven following steps. In the first step the sequence of samples is received, following which a set of branch metrics is computed at each time i from the received sequence of samples in a second step. The third and fourth steps respectively are to compute a set of $N_s$ forward state metrics, and a set of $N_s$ backward state metrics, at each time i, from the set of branch metrics. Following these two steps a maximum metric M for an MLSE sequence corresponding to the received sequence of samples is found, and then the sixth step is to compute maximum of all combined metrics at time i for at least one of the data bit values of 0 and 1, where a combined metric for a bit value at time i is the sum of a forward state metric, a branch metric, and a backward state metric, corresponding to a branch of the encoding trellis for said bit value at time i. The seventh step is to compute at least one output log likelihood ratio, corresponding to the data bit at time i, as the difference between one of the maximum of all combined metrics for data bit values 0 and 1 at time i and the maximum metric M. In embodiments of this aspect of the invention the convolutional encoding method that encoded the transmitted sequence of samples uses systematic convolutional encoding, and optionally may have used recursive systematic convolutional encoding. In other embodiments of the first aspect of the present invention M is computed as either the maximum of the last computed $N_s$ forward state metrics or as the maximum of the last computed $N_s$ backward state metrics. In further embodiments of the present invention the seventh step is performed such that if the maximum of all combined metrics at time i, for data bit 0, is less than the maximum metric M, then the output log likelihood ratio is calculated as the difference between the maximum of all combined metrics at time i, for data bit 0, and M, otherwise the output log likelihood ratio is calculated as the difference between the maximum metric M and the maximum of all combined metrics at time i, for data bit 1, alternatively the seventh step can be performed such that: if the maximum of all combined metrics at time i, for data bit 1, is less than the maximum metric M, then the output log likelihood ratio is calculated as the difference between the maximum metric M and the maximum of all combined metrics at time i, for data bit 1, otherwise the output log likelihood ratio is calculated as the difference between the maximum of all combined metrics at time i, for data bit 0, and M. In a still further embodiment of the present invention where the convolutional encoding method that encoded the transmitted sequence of samples uses systematic convolutional encoding, a set of systematic input log likelihood ratios, $L_{in}$, with an i-th element defined by $L_{in}(i)$, corresponding to the i-th data bit are used as an input, and the seventh step is performed such that if $L_{in}(i)<0$ and the maximum of all combined metrics at time i, for data bit 0, is less than M then the output log likelihood ratio is calculated as the difference between the maximum of all combined metrics at time i, for data bit 0, and M, if $L_{in}(i)<0$ and the maximum of all combined metrics at time i, for data bit 0, is greater than or equal to M then the output log likelihood ratio is calculated as the difference between the maximum metric M and the maximum of all combined metrics at time i, for data bit 1; if $L_{in}(i) \geq 0$ and the maximum of all combined metrics at time i, for data bit 1, is less than M then the output log likelihood ratio is calculated as the difference between the maximum metric M and the maximum of all combined metrics at time i, for data bit 1, and if $L_{in}(i) \geq 0$ and the maximum of all combined metrics at time i, for data bit 1, is greater than or equal to M then the output log likelihood ratio is calculated as the difference between the maximum of all combined metrics at time i, for data bit 0, and M.

In a second aspect of the present invention there is provided a method of max-log-APP decoding of a sequence of samples representing a transmitted sequence of symbols obtained from encoding a data sequence of bits, each having a bit time i, with a binary convolutional encoding method having $N_s$ states and an encoding trellis, said decoding method comprising the eight following steps. In the first step the sequence of samples is received, following which a set of branch metrics, at each time i, from the received sequence of samples is computed. In the third and fourth steps a set of $N_s$ forward state metrics and a set of backward state metrics, at each time i, from the set of branch metrics is computed. In the fifth and sixth steps an MLSE sequence, corresponding to the received sequence of samples is found, and subsequently a maximum metric M for the MLSE sequence is found. The seventh step is to compute the maximum of all combined metrics at time i for one of the data bit values of 0 and 1, where a combined metric for a bit value at time i is the sum of a forward state metric, a branch metric, and a backward state metric, corresponding to a branch of the encoding trellis for said bit value at time i. The eighth step is to compute at least one output log likelihood ratio, corresponding to the data bit at time i, as the difference between one of the maximum of all combined metrics for data bit values 0 and 1 at time i and the maximum metric M. In embodiments of this aspect of the invention the convolutional encoding method that encoded the transmitted sequence of samples uses systematic convolutional encoding, and optionally may have used recursive systematic convolutional encoding. In other embodiments of the first aspect of the present invention M is computed as either the maximum of the last computed $N_s$ forward state metrics or as the maximum of the last computed $N_s$ backward state metrics. In a further embodiments of the present invention the eighth step is performed such that if the i-th bit of the MLSE sequence has a value of 1 then the output log likelihood ratio is calculated as the difference between the maximum of all combined metrics at time i, for data bit 0, and M, otherwise the output log likelihood ratio is calculated as the difference between the maximum metric M and the maximum of all combined metrics at time i, for data bit 1. In other embodiments of the second aspect of the present invention the third and fifth steps are combined to implement a step of computing a set of forward state metrics and an MLSE sequence using a Viterbi decoding method, or the fourth and fifth steps are combined to implement a step of computing a set of backward state metrics and an MLSE sequence using a Viterbi decoding method. Alternatively, the MLSE sequence can be determined using one of the sets of forward and backward state metrics and a method of state metric retrace.

A third aspect of the present invention provides a method of iterative decoding of a sequence of samples representing a transmitted sequence of symbols obtained from encoding a data sequence of bits with a plurality of convolutional encoders, said decoding method comprising the steps of receiving said sequence of samples and performing $N_{dec}$ decoding operations each corresponding to one of the convolutional encoders. In this aspect, $N_{dec}$ is at least 3, each of the first $N_{dec}-1$ decoding operations uses a method of soft-in/soft-out decoding, to provide a soft input for the next decoding operation the final $N_{dec}$-th decoding operation uses a method of MLSE decoding to determine an MLSE sequence and at least two of the $N_{dec}$ decoding operations correspond to the same convolutional encoder. In embodiments of the present aspect of the invention at least one of the first $N_{dec}-1$ decoding operations uses a method of log-APP decoding or a method of max-log-APP decoding, and the final decoding operation uses a Viterbi decoding method to determine the MLSE sequence, or the final decoding operation computes state metrics and uses a method of state metric retrace to determine the MLSE sequence. Alternatively the final decoding operation can use a method of max-log-APP decoding with an extrinsic information scale factor of one to determine the MLSE sequence.

In another aspect of the present invention there is provided a method of iterative decoding of a sequence of samples representing a transmitted sequence of symbols obtained from encoding a data sequence of bits with a plurality of convolutional encoders, said decoding method comprising the following steps. The first step is to receive the sequence of samples. The second step is to perform $N_{dec}$ decoding operations each corresponding to one of the convolutional encoders, where $N_{dec}$ is at least 2, wherein each of the first $N_{dec}-1$ decoding operations uses a method of soft-in/soft-out decoding, to provide a soft input for the next decoding operation, and where at least one of the first $N_{dec}-1$ decoding operations computes a set of $N_s$ forward state metrics and a set of $N_s$ backward state metrics, at each time i, from a set of branch metrics computed from a sequence of samples from the output of the previous decoding operation; finds a maximum metric M for an MLSE sequence corresponding to the sequence of samples from the output of the previous decoding operation; computes the maximum of all combined metrics at time i for at least one of the data bit values of 0 and 1, where a combined metric for a bit value at time i is the sum of one of the set of $N_s$ forward state metrics, a branch metric from the set of branch metrics, and one of the set of $N_s$ backward state metrics, corresponding to a branch of the encoding trellis for said bit value at time i; and computes at least one output log likelihood ratio, corresponding to the data bit at time i, as the difference between one of the maximum of all combined metrics for data bit values 0 and 1 at time i and the maximum metric M; and the final $N_{dec}^{th}$ decoding operation uses a method of MLSE decoding to determine an MLSE sequence.

In another aspect of the present invention there is provided a method of iterative decoding of a sequence of samples representing a transmitted sequence of symbols obtained from encoding a data sequence of bits with a plurality of convolutional encoders, said decoding method comprising the steps of receiving said sequence of samples and performing $N_{dec}$ decoding operations each corresponding to one of the convolutional encoders, where $N_{dec}$ is at least 2. In this aspect each of the first $N_{dec}-1$ decoding operations uses a method of soft-in/soft-out decoding, to provide a soft input for the next decoding operation, where at least one of the first $N_{dec}-1$ decoding operations computes a set of $N_s$ forward state metrics and a set of $N_s$ backward state metrics, at each time i, from a set of branch metrics computed from a sequence of samples from the output of the previous decoding operation; finds an MLSE sequence, corresponding to the sequence of samples from the output of the previous decoding operation, finds a maximum metric M for an MLSE sequence corresponding to the sequence of samples from the output of the previous decoding operation; computes the maximum of all combined metrics at time i for one of the data bit values of 0 and 1, where a combined metric for a bit value at time i is the sum of one of the set of $N_s$ forward state metrics, a branch metric from the set of branch metrics, and one of the set of $N_s$ backward state metrics, corresponding to a branch of the encoding trellis for said bit value at time i; and computes at least one output log likelihood ratio, corresponding to the data bit at time i, as the difference between one of the maximum of all combined metrics for data bit values 0 and 1, at time i and the maximum metric M and the final $N_{dec}^{th}$ decoding operation uses a method of MLSE decoding to determine an MLSE sequence.

In another aspect of the present invention there is provided a method of iterative decoding of a sequence of samples representing a transmitted sequence of symbols obtained from encoding a data sequence of bits with a plurality of systematic convolutional encoders, said decoding method comprising the following nine steps. The first step is to receive the sequence of samples. The second step is to specify a maximum number $D_{max}$ of decoding operations, where $D_{max}$ is at least 2, and each decoding operation corresponds to one of the systematic convolutional encoders. The third step is to specify a minimum number $D_{min}$ of decoding operations, where $D_{min}$ is at least 1, and then to specify a preferred number $D_{ag}$ of consecutive agreements, between two consecutive MLSE sequences, where $D_{ag}$ is at least 1. Then the number of decoding operations is counted and stored as $N_{dec}$, which is subsequently tested to see if it is equal to $D_{max}$. When the test is true the iterative decoding method is stopped. The eighth step is to count the number of consecutive agreements, $N_{ag}$, between two consecutive MLSE sequences and then to test if $N_{ag}$ is equal to $D_{ag}$ and stopping the iterative decoder method when true. In the above described aspect each of the first $N_{dec}-1$ decoding operations uses a method of soft-in/soft-out decoding, each decoding operation from $D_{min}-D_{ag}$ to $N_{dec}-1$ uses a first method of MLSE decoding to find an MLSE sequence, the final $N_{dec}$-th decoding operation uses a second method of MLSE decoding to find a final MLSE sequence and if $D_{min}-D_{ag}=0$ then the 0-th MLSE sequence is determined from a systematic portion of the received sequence of samples independent of any decoding operations. In embodiments of the present aspect the soft-in/soft-out decoding method can use a method of log-APP decoding or a method of max-log-APP decoding. Additionally the second method of MLSE decoding can use a Viterbi decoding method to determine the final MLSE sequence or the second method of MLSE decoding computes state metrics and uses a method of state metric retrace to determine the final MLSE sequence. Alternatively the second method of MLSE decoding uses a method of max-log-APP decoding with an extrinsic information scale factor of one to determine the final MLSE sequence. Another embodiment of the present aspect further comprises the step of specifying a maximum number of iterative decoding repetitions, $I_{max}$, where $I_{max}$ is at least 1 prior to receiving said sequence of samples, and following the eighth step, the steps of counting the number of iterative decoding repetitions performed as $N_{it}$; and performing a test if $N_{dec}$ is equal to $D_{max}$ and if $N_{ag}$ is less than $D_{ag}$ and if $N_{it}$ is less than $I_{max}$; such that if the test is true, then a further repetition is performed wherein a sequence of decoding operations is different from a corresponding sequence of decoding operations used in all previous repetitions of iterative decoding.

In another aspect of the present invention there is provided a method of iterative decoding of a sequence of samples representing a transmitted sequence of symbols obtained from encoding a data sequence of bits with a plurality of convolutional encoders, said decoding method comprising the steps of receiving said sequence of samples and performing $N_{dec}$ decoding operations each corresponding to one of the convolutional encoders, where $N_{dec}$ is at least 2. In this aspect of the present invention $N_{dec}$ is equal to $N_1+N_2$, where $N_1$ is a number of first decoding operations and is at least 1, and $N_2$ is a number of second decoding operations and is at least 1, each of the $N_1$ first decoding operations uses a method of log-APP decoding and each of the $N_2$ second decoding operations uses a method of max-log-APP decoding. In an embodiment of this aspect of the present invention a method of early stopping based on comparing consecutive MLSE sequences where each MLSE sequence corresponds to one of the decoding operations is included.

In another aspect of the present invention there is provided a method of iterative decoding off a sequence of samples representing a transmitted sequence of symbols obtained from encoding a data sequence of bits with a plurality of convolutional encoders, said decoding method comprising the steps of receiving said sequence of samples and performing $N_{dec}$ decoding operations each corresponding to one of the convolutional encoders, where $N_{dec}$ is at least 3. In this aspect of the present invention $N_{dec}$ equals $N_1+N_2+1$, where $N_1$ is a number of first decoding operations and is at least 1, $N_2$ is a number of second decoding operations and is at least 1, and there is a single third decoding operation, each of the $N_1$ first decoding operations uses a method of log-APP decoding, each of the $N_2$ second decoding operations uses a method of max-log-APP decoding and the single third decoding operation uses a method of MLSE decoding. In an embodiment of the present aspect of the invention a method of early stopping based on comparing consecutive MLSE sequences where each MLSE sequence corresponds to one of the decoding operations is included.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Exemplary embodiments of the invention will now be further described with references to the drawings in which same reference numerals designate similar parts throughout the figures thereof, and wherein.

DESCRIPTION OF THE INVENTION

Figure 1:
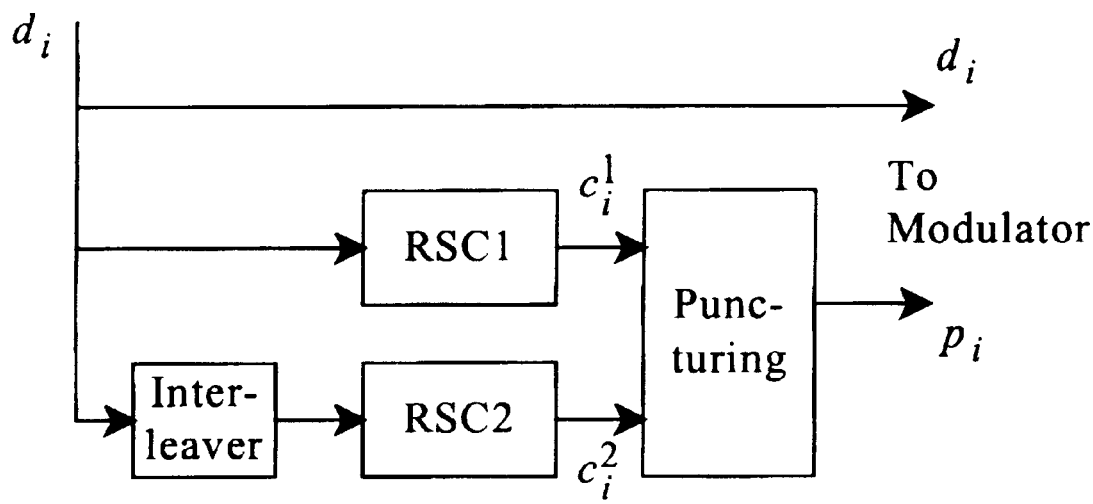
FIG. 1 illustrates, in a block diagram, a Turbo-code encoder using two recursive systematic convolutional (RSC) encoders with puncturing according to prior art.

The invention will now be described while making reference to relevant equations known in the art.

As discussed in the background, the forward and backward state metric calculations for the max-log-APP algorithm, as defined in (27) and (28) respectively, are identical to the state metric calculations required by a Viterbi algorithm going forwards and backwards in time, respectively. Thus, much of what has been learned about implementing efficient Viterbi algorithms can be taken advantage of directly. Attention is now given to the operations defined in (26), which are not part of a conventional Viterbi algorithm. Also, it is recognized that the problem is symmetric in that it doesn't matter whether the forward or backward state metrics are computed first. In describing the invention, we will generally assume that the forward state metrics are computed first, to be consistent with the background discussion, but this is arbitrary.

For better clarity, equation (26) is subdivided as follows:

$$L_i = \max_i(0) - \max_i(1) \tag{33}$$

with $$\max_i(0) = \max_m \left[ A_i^m + D_i^{0,m} + B_{i+1}^{f(0,m)} \right] \tag{34}$$

$$\max_i(1) = \max_m \left[ A_i^m + D_i^{1,m} + B_{i+1}^{f(1,m)} \right] \tag{35}$$

Equation (33) defines $L_i$, which is the LLR for the systematic bit at time i. Equation (34) defines $\max_i(0)$, which is the maximum combined metric for all branches corresponding to a systematic bit value of 0 at time i. Equation (35) defines $\max_i(1)$, which is the maximum combined metric for all branches corresponding to a systematic bit value of 1 at time i. It is understood that each max[.] operation is over all $N_s$ states, that is m=0 . . . $N_s$−1 in (34) and (35). It follows from the properties of maximum likelihood sequence estimation (MLSE) and the Viterbi algorithm that $\max_i(0)$ is the metric associated with the MLSE sequence having a 0 at time i, and that $\max_i(1)$ is the metric associated with the MLSE sequence having a 1 at time i. One of these two maximum combined metrics must be the metric associated with the actual unconstrained MLSE sequence, which is unique (assuming no ties). The other maximum combined metric must always be smaller. Thus, the max-log-APP algorithm always finds the same MLSE sequence, and corresponding metric, as the Viterbi algorithm (given sufficient history depth for all paths to merge, and apart from any constant metric offset due to metric normalization). This result is used in various embodiments of the present invention to reduce the number of computations required in (34) and (35), as described below.

Let the metric for the MLSE sequence be M, then in accordance to one embodiment, M is simply found as follows:

$$M = \max_m [A_{K+1}^m] \tag{36}$$

That is, M is the maximum of the final $N_s$ forward state metrics computed at the end of the K input LLR's. Of course, if the ending state is known then the state metric for the known ending state is used. Thus, the maximum combined metric at every time i is always M. It is unknown whether the maximum combined metric corresponds to a 0-bit branch or a 1-bit branch of the trellis at time i. Assume that the 0-bit branches are searched first (arbitrary). If searching all the 0-bit branches for the maximum combined metric finds combined metric $\max_i(0)<M$, then it is known that the maximum combined metric for the 1-bit branches is $\max_i(1)=M$, and no further work is required. This saves all the processing in (35) for this case. If searching all the 0-bit branches finds combined metric M then all the 1-bit branches must still be searched to find combined metric $\max_i(1)<M$. No processing is saved in this case. Given random data, each case will occur half the time and 25% of the combined metric processing will be saved on average. From (33), the output LLR at time i is given by $L_i=\max_i(0)-M$ for the first case, and $L_i=M-\max_i(1)$ for the second case. It is clear that this technique is trivial to implement and provides a substantial reduction in combined metric processing.

In accordance with another embodiment, the approach described is further improved as follows. In the case that the algorithm can predict which bit value was more likely to be on the overall MLSE path at time i, and that the algorithm performs the combined metric processing for the opposite bit value first, then half the combined metric processing is eliminated every time this prediction is correct. This prediction is simply made by checking the sign of the input LLR corresponding to the systematic bit at each time i. For the very first max-log-APP decoding operation, the probability of an incorrect prediction is the probability of a raw channel bit error, which is typically less than 20% for most operating points of interest. With iterative processing, such as in the modified Turbo decoder of FIG. 4, this prediction will improve with every max-log-APP decoding operation, just as the Turbo decoder's error rate improves with every iteration. Thus, the combined metric processing is typically reduced by 40% or more, up to a maximum of 50%. This technique is also trivial to implement and offers a significant further reduction in combined metric processing.

Figure 4:
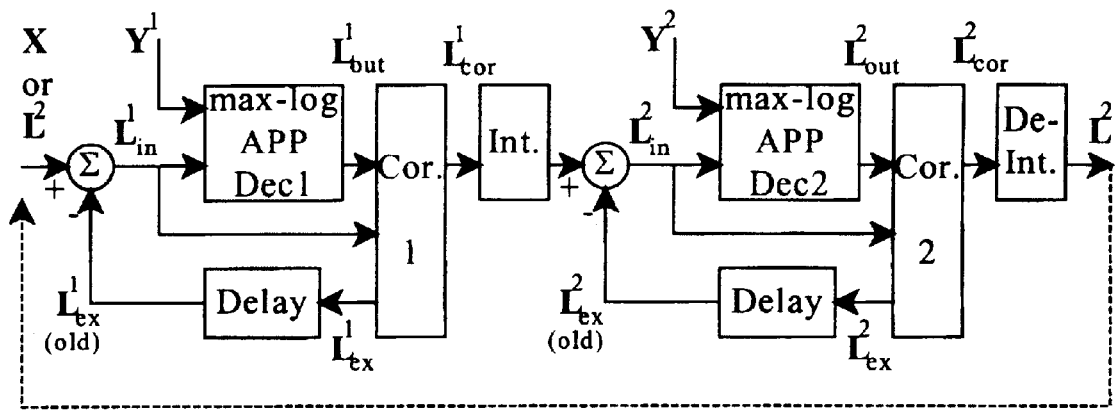
FIG. 4 illustrates, in a block diagram, a modified Turbo decoder using two max-log-MAP component decoders, according to prior art, and corrected output LLR's and corrected extrinsic information according to co-pending U.S. patent application No. 60/055,611.
Figure 5:
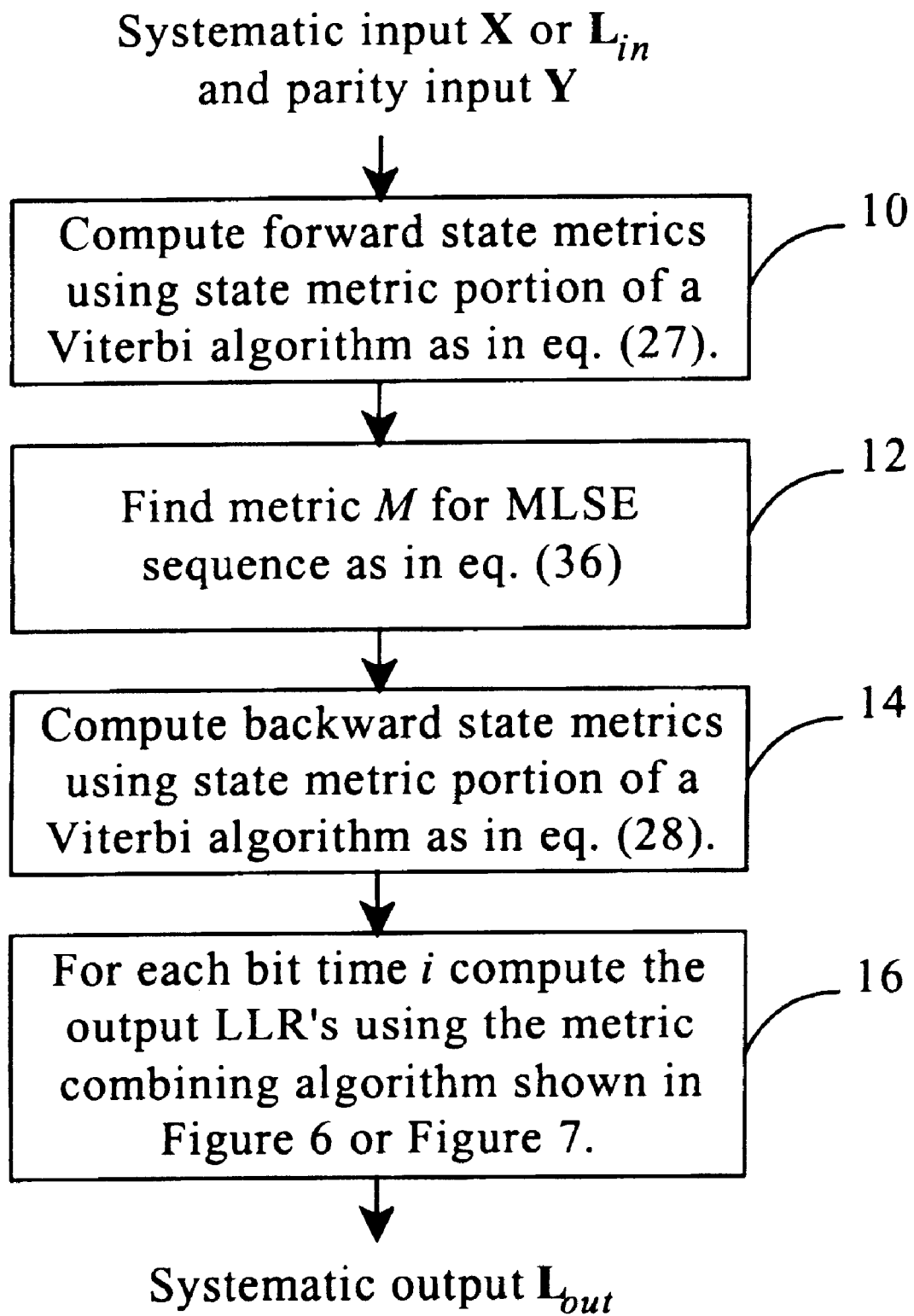
FIG. 5 illustrates, in a flow diagram, a method of performing low-complexity max-log-APP decoding in accordance with one aspect of this invention.
Figure 6:
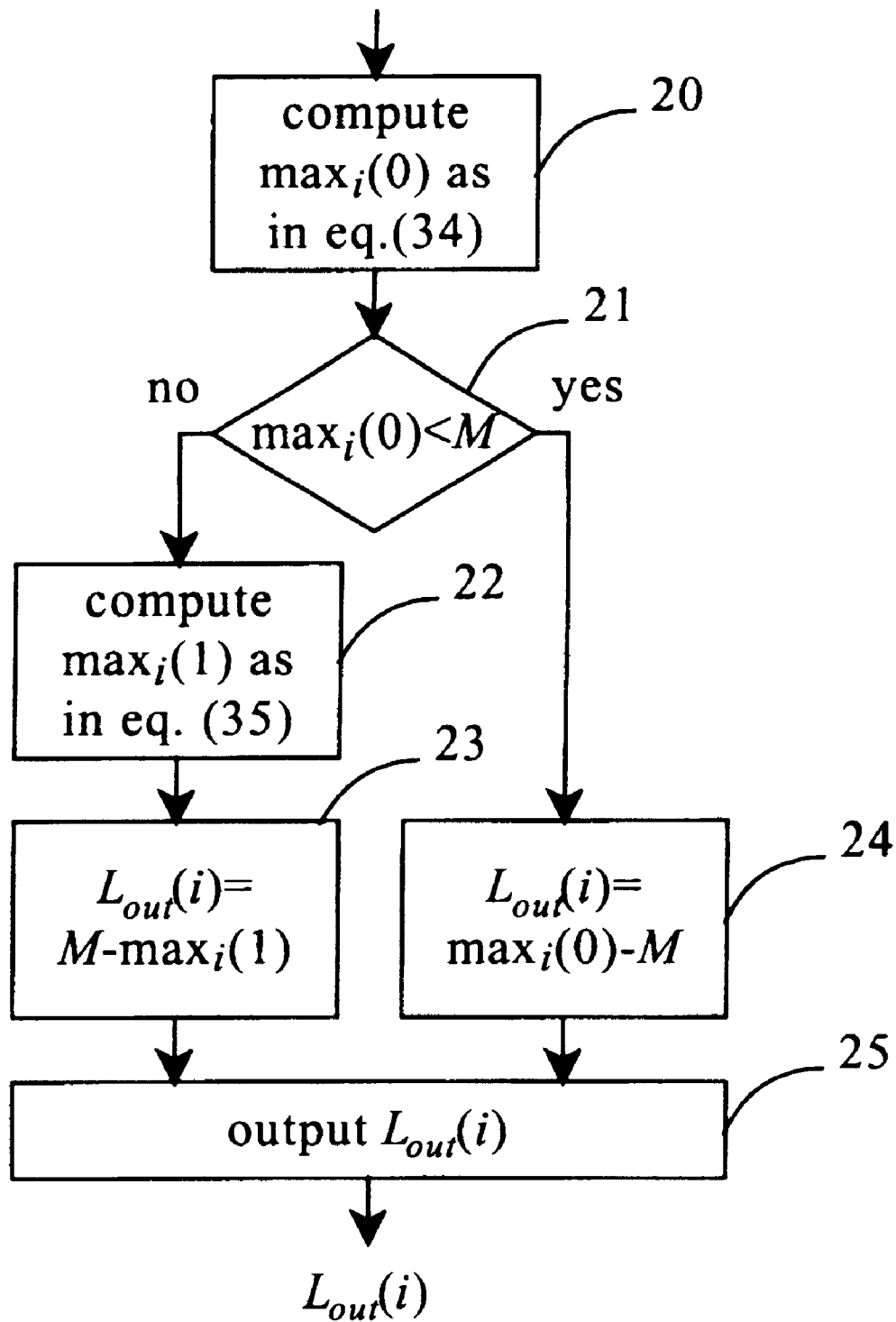
FIG. 6 illustrates, in a flow diagram, an embodiment for performing the metric combining step shown in FIG. 5 based on guessing the bits of an MLSE sequence.
Figure 7:
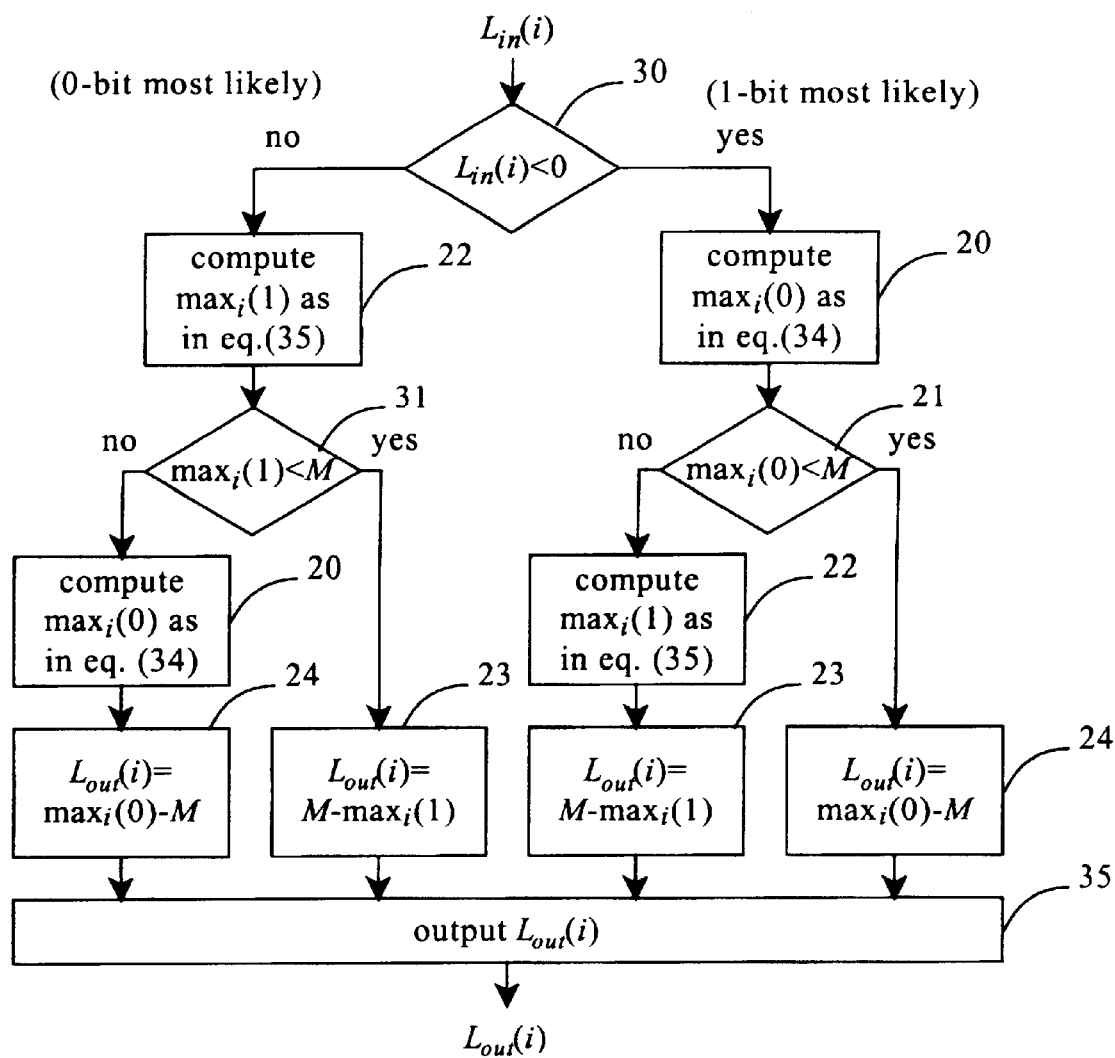
FIG. 7 illustrates, in a flow diagram, another embodiment for performing the metric combining step shown in FIG. 5 based on predicting the bits of an MLSE sequence.

FIGS. 5, 6, and 7 show how these two methods of combined metric processing are incorporated into a maxlog-APP decoder, such as the max-log-APP decoders of FIG. 4 in accordance with this invention. FIG. 5 illustrates, in a flow diagram, the common steps for these two methods of performing max-log-APP decoding. The inputs are the systematic channel sample vector X corresponding to the systematic bits and the parity channel sample vector Y corresponding to the parity bits of one or more convolutional encoders. Or, the systematic vector could be a set of updated LLR's, $L_{in}$, if the decoder is used as part of an iterative decoding process. (X is really a special case of $L_{in}$, thus the $L_{in}$ terminology will be used in what follows.) In FIG. 5, the first step 10 is to compute the forward state metrics using the state metric portion of a Viterbi algorithm as in (27). The second step 12 is to find the maximum metric for the MLSE sequence as in (36). The third step 14 is to compute the backward state metrics using the state metric portion of a Viterbi algorithm as in (28). The fourth step 16 is to compute the output LLR's, $L_{out}$, one for each time i, $L_{out}(i)$, using one of the two methods of metric combining described next.

FIG. 6 shows the steps required in an embodiment for performing low-complexity metric combining shown in FIG. 5 based on guessing the bits of an MLSE sequence. The method shown inherently assumes that the MLSE bit at time i is always a 1-bit. This is arbitrary and a similar method applies if the MLSE bit is assumed to be a 0-bit. The first step 20 is to compute $\max_i(0)$ as in (34). The second step 21 is to test if $\max_i(0)$ is less than M. If yes, then step 24 is performed by computing the appropriate LLR value $L_{out}(i)$ as $\max_i(0)-M$. If no, then steps 22 and 23 are performed where step 22 computes $\max_i(1)$ as in (35) and step 23 computes the appropriate output LLR value $L_{out}(i)$ as $M-\max_i(1)$. Finally step 25 is performed to simply output the correct LLR value.

FIG. 7 shows the steps required in another embodiment for performing low-complexity metric combining shown in FIG. 5 based on predicting the bits of an MLSE sequence. An input at time i is the i-th input LLR, $L_{in}(i)$. This value is used to predict the MLSE bit at time i. The first step 30 is to test if $L_{in}(i)$ is less than 0. If yes, then a 1-bit is most likely and the steps on the right side of FIG. 7 are used. These steps, 20 through 24, and their order are identical to those shown in FIG. 6. If no, then the 0-bit is most likely and the steps 22, 31, 20, 24 and 23 on the left side of FIG. 7 are used. Step 31 is to test if $\max_i(1)$ is less than M, and the remaining steps are as described above. These steps are symmetrical to the other steps 20–24 shown on the right side of FIG. 7. Finally, step 35 is performed to simply output the correct LLR value.

The metric combining embodiment of FIG. 6 as described above guesses the bits of the MLSE sequence. The other embodiment of FIG. 7 as described above predicts the bits of the MLSE sequence from the input LLR's with more reliability, but still uses guessing. In either embodiment, it is not necessary to separately generate the actual MLSE sequence to perform metric combining. The MLSE sequence can be determined, however, from the signs of the output LLR's, $L_{out}$, after the combined metric processing is completed.

In the following, two alternative embodiments are described which determine the MLSE sequence directly, as an intermediate step.

In one such embodiment, a full Viterbi algorithm, including the usual steps of history updating and decision making, is used when calculating the forward (or backward) state metrics. This provides the MLSE sequence directly before any backward state metrics, combined metrics, and output LLR's are calculated. This embodiment ensures to eliminate half the combined metric processing because the MLSE bit value at each time i will always be known before the combined metrics are calculated. The processing for this embodiment is more deterministic because it is not dependent on guessing the correct MLSE bit value. This embodiment is particularly suited to those processors and/or algorithms where the history handling can be performed with relatively little overhead. As described further below, iterative Turbo decoders can take advantage of the feature in that the MLSE sequence is determined prior to calculating the backward state metrics, combined metrics output LLR's.

Figure 8:
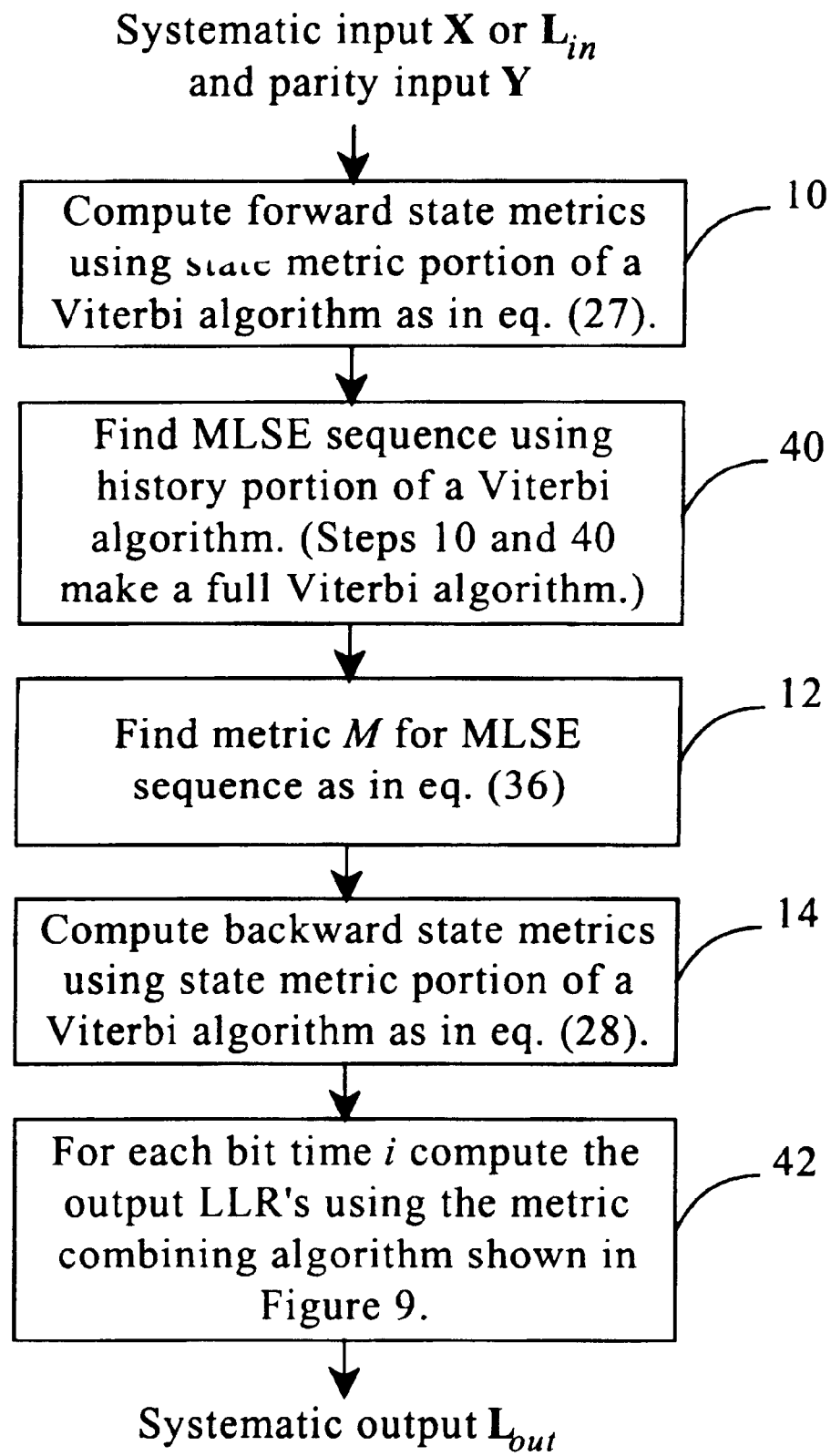
FIG. 8 illustrates, in a flow diagram, a method of performing low-complexity max-log-APP decoding in accordance with another aspect of this invention where the history portion of a Viterbi algorithm is used to determine an MLSE sequence.

FIG. 8 illustrates, in a flow diagram, this Viterbi history method of performing low-complexity max-log-APP decoding. The inputs are the same as in FIG. 5. The first step 10 is to compute the forward state metrics using the state metric portion of a Viterbi algorithm as in (27). The second step 40 is to find the MLSE sequence using the history portion of a Viterbi algorithm. Steps 10 and 40 are preferably executed together as a full Viterbi algorithm. The third step 12 is to find maximum metric M for the MLSE sequence as in (36). The fourth step 14 is to compute the backward state metrics using the state metric portion of a Viterbi algorithm as in (28). The fifth step 42 is to compute the output LLR's, $L_{out}$, one for each time i, $L_{out}(i)$, using the method of metric combining described below and shown in FIG. 9.

Figure 9:
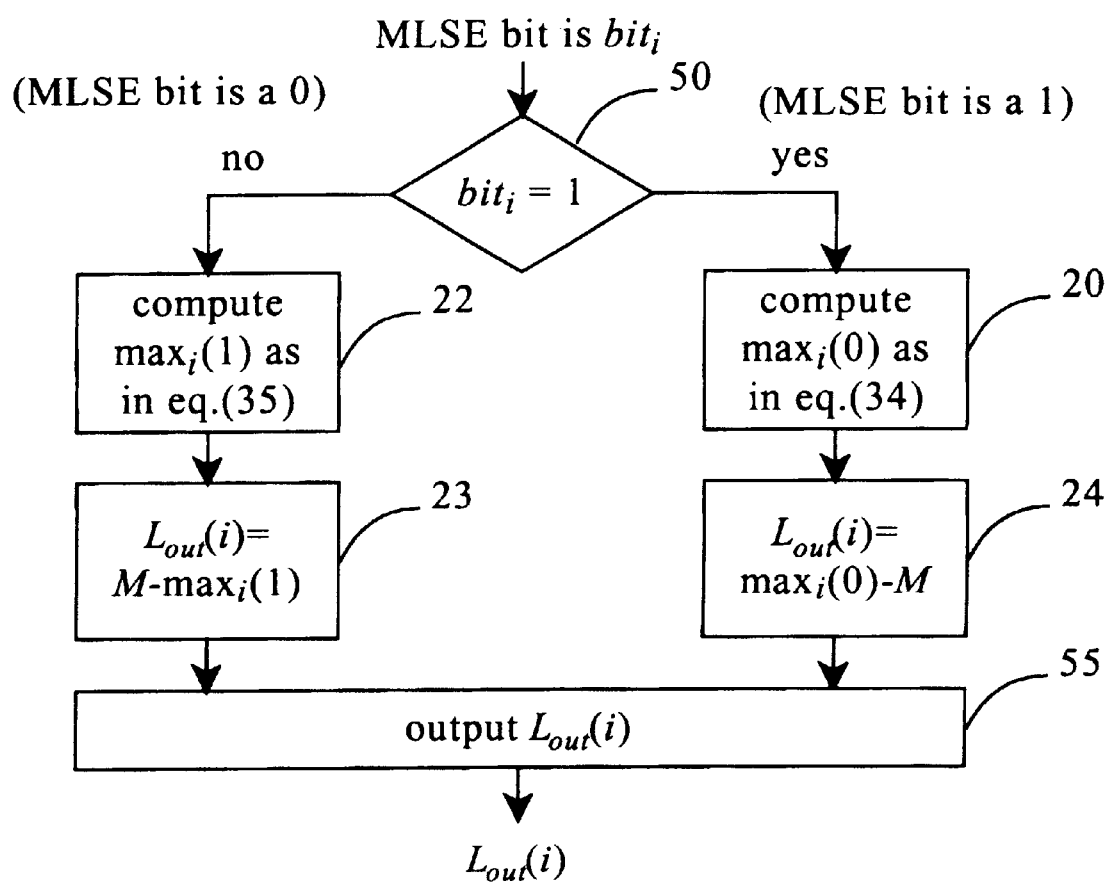
FIG. 9 illustrates, in a flow diagram, an embodiment for performing the metric combining step shown in FIG. 8 based on knowing the bits of an MLSE sequence.

FIG. 9 illustrates, in a flow diagram, an embodiment performing low-complexity metric combining based on knowing the bits of an MLSE sequence. An input at time i is the i-th bit of the MLSE sequence, referred to as the i-th MLSE bit, $bit_i$. The first step 50 is to test if $bit_i$ equals 1. If yes then steps 20 and 24 are used, as described before and shown on the right of FIG. 9. If no then steps 22 and 23 are used, as shown on the left, and as described before. Finally, step 55 is to simply output the correct LLR value.

The MLSE sequence can be determined in another way, without the history processing usually associated with a full Viterbi decoder. Conventional Viterbi decoders typically only store a new set of $N_s$ state metrics and an old set of $N_s$ state metrics. The new set is updated from the old set and then the new set becomes the old set for the next bit time. This saves memory. This is also why history processing is required for each state. In contrast a max-log-APP decoder as used in this embodiment, is required to store the entire set of forward (or backward) state metrics for the entire data block (or sub-block if overlapped sub-block processing is used). Thus, the MLSE sequence is easily determined by finding the most likely ending state, with state metric M, and retracing through the trellis from the most likely ending state using the stored state metrics and branch metrics. The winning previous state is the one that gives the winning current state metric when the previous state metric and associated branch metric are combined. This is expressed more rigorously as follows. Given the winning state m at time i+1, and corresponding forward state metric $A_{i+1}^m$, the winning preceding state at time i must satisfy $$A_{i+1}^m = A_i^{b(bit_i,m)} + D_i^{bit_i,b(bit_i,m)} \qquad (37)$$

where $bit_i$ and $b(bit_i,m)$ are the winning bit and state values, respectively, at time i. Note that the right side of (37) only has to be evaluated for one bit value. If (37) is not satisfied for the bit value selected then the most likely bit value must be the other bit value. This state metric retrace approach of determining the MLSE sequence is very efficient because the processing is not a function of the number of states. Only a single winning state needs to be considered at each step of the retrace process. As for the Viterbi history algorithm, the MLSE sequence can be determined prior to calculating the backward state metrics, combined metrics, and output LLR's, thereby saving approximately 50% of the combined metric processing.

For some processors, it is preferable that the MLSE sequence is determined at the same time as the backward state metrics, combined metrics, and LLR's are calculated, on a bit-by-bit basis, in order to save reading the forward state metrics and branch metrics from memory multiple times, and reuse some intermediate calculations. However, this approach is not as well suited to the iterative Turbo decoding embodiments described further below.

Figure 10:
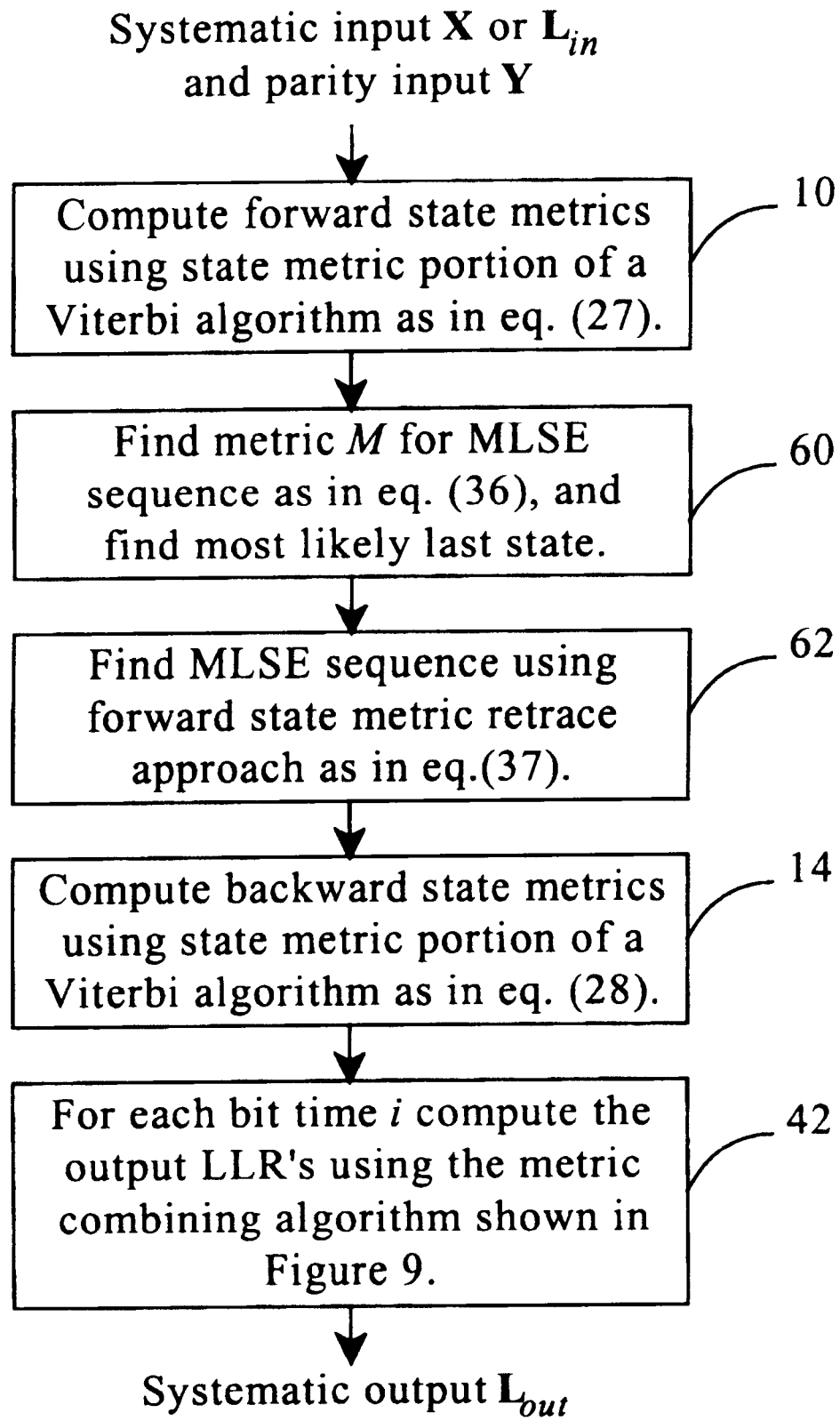
FIG. 10 illustrates, in a flow diagram, another method of performing low-complexity max-log-APP decoding in accordance with yet another aspect of this invention, where a state metric retrace method is used to determine an MLSE sequence and the combined metric processing is performed according to FIG. 9.

FIG. 10 illustrates, in a flow diagram, this embodiment performing low-complexity max-log-APP decoding using the state metric retrace method. The inputs are the same as in FIG. 5. The first step 10 is to compute the forward state metrics using the state metric portion of a Viterbi algorithm as in (27). The second step 60 is to find maximum metric M for the MLSE sequence as in (36), and to find the corresponding most likely ending state. Of course, if the ending state is known then this state and its metric are used. The third step 62 is to find the MLSE sequence using a state metric retrace approach, using the forward metrics, as indicated in (37). The fourth step 14 is to compute the backward state metrics using the state metric portion of a Viterbi algorithm as in (28). The fifth step 42 is to compute the output LLR's, $L_{out}$, one for each time i, $L_{out}(i)$, using the method of metric combining shown in FIG. 9, as described previously.

It should be pointed out that the term MLSE sequence in the context of iterative decoding does not necessarily mean a true maximum likelihood sequence, but it is rather loosely used to refer to a sequence generated by a decoder derived from maximum likelihood sequence estimation (MLSE) principles. For example, the assumptions required for true MLSE detection might be valid for a first decoding step of an iterative decoder, but the assumptions will be less valid for subsequent decoding steps, due to dependencies caused by the iterative processing. This point is also relevant to sequences generated by log-APP and max-log-APP decoders.

Figure 3:
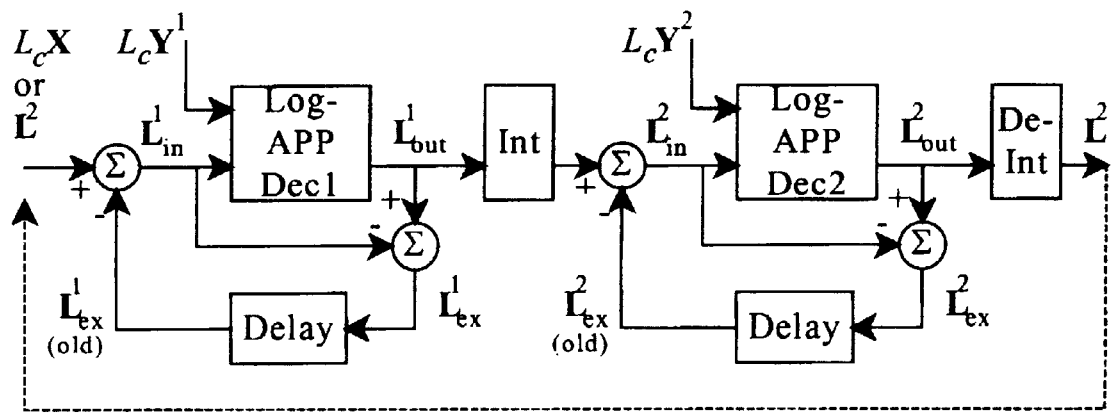
FIG. 3 illustrates, in a block diagram, a Turbo decoder using two log-APP component decoders according to prior art.

We now describe a number of embodiments that improve upon the Turbo and modified Turbo decoders discussed in the background section, and shown in FIGS. 3 and 4. The modified Turbo decoder uses iterative max-log-APP processing with scaled extrinsic information, as indicated in (31) and (32). The best scale factor is usually less than 1. We have found, however, that a scale factor of 1 is best for the final step of max-log-APP processing, especially when trying to minimize packet error rate. As pointed out earlier, a max-log-APP decoder, when used with an extrinsic information scale factor of 1, provides the same final decisions as an MLSE decoder. Thus, the final step of log-APP or max-log-APP decoding can be replaced with a simpler step of MLSE decoding. It is to be noted that the last two approaches to reduced-complexity max-log-APP decoding, shown in FIGS. 8 and 10 respectively, compute an MLSE sequence as an intermediate step. Thus, if one of these approaches to max-log-APP decoding is used, not only 50% of the combined metric processing is saved for each max-log-APP decoding operation, but the last decoding step can stop after the MLSE sequence is determined. This eliminates all the processing associated with computing the backward state metrics, the combined metrics, and the LLR's, for the last decoding step.

Early stopping techniques can significantly reduce the average amount of processing required by an iterative decoder, without significantly degrading error rate performance. Obviously the processing associated with an early stopping technique must also be small compared to the core processing to be worth implementing. The Turbo and modified Turbo decoders described above are now extended to include a simple and highly effective early stopping technique.

A simple early stopping technique that we found to work well, especially in combination with the other methods described above, is to compare the MLSE sequences associated with each log-APP or max-log-APP decoding operation to see if the MLSE sequences are changing with time. The robustness of this approach is specified by setting a desired number of consecutive agreements between two consecutive MLSE sequences, $D_{ag}$. It has been found experimentally that very little degradation (typically only a few hundredths of a dB, and only at high SNRs) occurs by requiring only one agreement between two consecutive MLSE sequences before stopping.

This early stopping technique is not only effective but it requires little additional processing when used with the last two methods of max-log-APP decoding described above. The reason is because these methods of max-log-APP decoding compute an MLSE sequence as an intermediate step, to save processing, and thus each MLSE sequence is essentially available for free (except for storage). Further, the remaining processing of calculating the backward state metrics, the combined metrics, and the output LLR's can also be avoided for the last decoding operation, when the early stopping criterion is satisfied.

Noting that the corresponding bits of consecutive MLSE sequences only need to be compared until a single disagreement occurs can reduce the processing associated with the early stopping technique even further. For the first few log-APP or max-log-APP decoding operations a disagreement is almost certain to occur early on in the comparison. Even when only one bit differs between the two MLSE sequences, only half of the bits will need to be compared, on average. A complete comparison is only necessary for the last few decoding operations, when the MLSE sequences agree. A small amount of processing can also be saved by not invoking the early stopping test until a minimum number of decoding operations, $D_{min}$, are performed. A maximum number of decoding operations, $D_{max}$, is also required to stop the iterative decoder when the early stopping technique fails to indicate any convergence.

Figure 11:
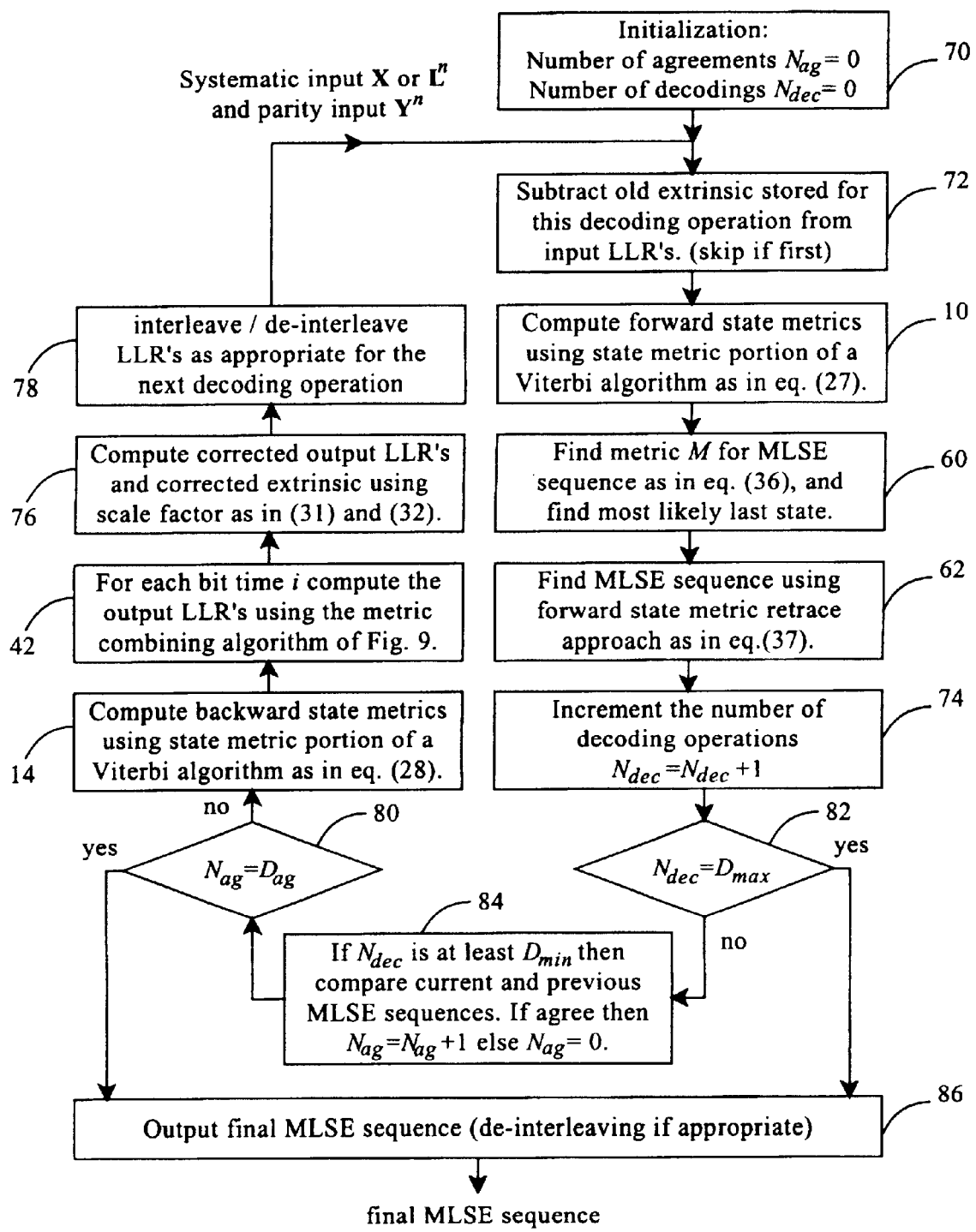
FIG. 11 illustrates, in a flow diagram, a Turbo decoding embodiment including a method of early stopping based on comparing consecutive MLSE sequences, and the method of max-log-APP decoding is performed according to FIG. 10.

FIG. 11 illustrates, in a flow diagram, a Turbo decoding embodiment including a method of early stopping based on comparing consecutive MLSE sequences as discussed above. The first step 70 is to initialize the number of consecutive agreements, $N_{ag}$, between two consecutive MLSE sequences, and to initialize the number of decoding operations performed, $N_{dec}$. The inputs to the current decoding process are the appropriate LLR's (X or L") and parity channel sample vector $Y^n$, where n distinguishes the different RSC encodings performed in the Turbo-code encoder. One pass through FIG. 11 represents one decoding operation, corresponding to one of the RSC encodings performed in the Turbo-code encoder. This figure is general in that it is not restricted to Turbo-codes with just 2 parallel RSC encodings. The second step 72 is to subtract the old extrinsic information stored for this decoding operation from the input LLR's. This step can be skipped if the old extrinsic information is all zeros, as for the first few decoding operations. The third step 10 is to compute the forward state metrics using the state metric portion of a Viterbi algorithm as in (27). The fourth step 60 is to find maximum metric M for the current MLSE sequence as in (36), and to find the corresponding most likely ending state. The fifth step 62 is to find the current MLSE sequence using a state metric retrace approach, using the forward metrics, as indicated in (37). The sixth step 74 is to increment the number of decoding operations performed. The seventh step 82 is to test if the number of decoding operations performed equals the maximum number of decoding operations allowed, $D_{max}$. If yes, then the final step 86 outputs the final MLSE sequence, de-interleaving if appropriate. If no, then an eighth step 84 is performed, which first tests to see if the minimum number of decoding operations, $D_{min}$, has been performed. If yes, then the current and previous MLSE sequences are compared. If they agree, then the number of agreements, $N_{ag}$, is incremented. If they do not agree, then $N_{ag}$ is reset to 0. The ninth step 80 is then to test if the number of agreements equals the desired number of agreements, $D_{ag}$. If yes, then the final step 86 outputs the final MLSE sequence, de-interleaving if appropriate. If no, then a tenth step 14 is performed, which computes the backward state metrics using the state metric portion of a Viterbi algorithm as in (28). The eleventh step 42 is then to compute the output LLR's, $L_{out}$, one for each time i, $L_{out}(i)$, using the method of metric combining shown in FIG. 9, as described previously. The twelfth step 76 is to compute the corrected output LLR's and corrected extrinsic information using an extrinsic information scale factor as in (31) and (32). The last step 78, before returning to the second step 72, is to interleave or de-interleave the corrected output LLR's, as appropriate, for the next decoding operation.

A key to the success of the MLSE-based early stopping technique is the fact that MLSE sequences are being compared. It is also important that the final decision sequence be the last MLSE sequence obtained, or one of the last $D_{ag}+1$ MLSE sequence, since they are the same when the early stopping test is satisfied. Several other simple early stopping techniques have been tried and they do not work as well. For example, it has been found that comparing the signs of consecutive LLR sequences does not work well, especially at high SNRs. This is true for both log-APP decoding, and max-log-APP decoding with an extrinsic information scale factor less than one.

In an alternate embodiment, the early stopping technique is used to improve performance in another way, wherein, the early stopping technique is used to detect a situation where the Turbo decoder fails to converge to a stable solution. This is achieved by noting when the maximum number of log-APP or max-log-APP decoding operations, $D_{max}$, has been reached without the stopping criterion being satisfied. Here, the Turbo decoder is given a second chance by perturbing the inputs or changing the startup conditions. Preferably, the Turbo decoding process is started again using the second set of parity first. Even though the amount of processing is significantly increased for those cases where a second Turbo decoding is performed, with the early stopping technique the average amount of processing is only increased slightly at most operating points of interest.

A number of hybrid log-APP/max-log-APP embodiments for performing Turbo decoding are also possible. As indicated in the background section, the log-APP decoding algorithm can be implemented using the same max operations as the max-log-APP decoding algorithm, but with an additional correction term that can be looked up in a table. Even through the table lookup approach sounds simple, the required processing is typically about 3 times that of the max-log-APP approaches described above, when implemented on a general purpose DSP. Although the improvement in performance is typically only 0.1 to 0.2 dB, it is still worthwhile for some applications.

An effective hybrid embodiment for performing Turbo decoding, that does not require changing the core algorithms themselves, is to use a log-APP decoding algorithm for the first few decoding operations followed by a max-log-APP decoding algorithm, with scaled extrinsic information, for the remaining decoding operations. The early stopping technique is turned on when switching to the max-log-APP decoding algorithm. There is an obvious tradeoff between performance and complexity. However, most of the gains in performance are obtained with only a few log-APP decoding operations. It should be noted that the systematic and parity channel sample vectors, X, $Y^1$ and $Y^2$, need to be scaled by the channel reliability factor, $L_c$, and this factor needs to be estimated, in order to use the log-APP decoding algorithm for the first few decoding operations.

Figure 2:
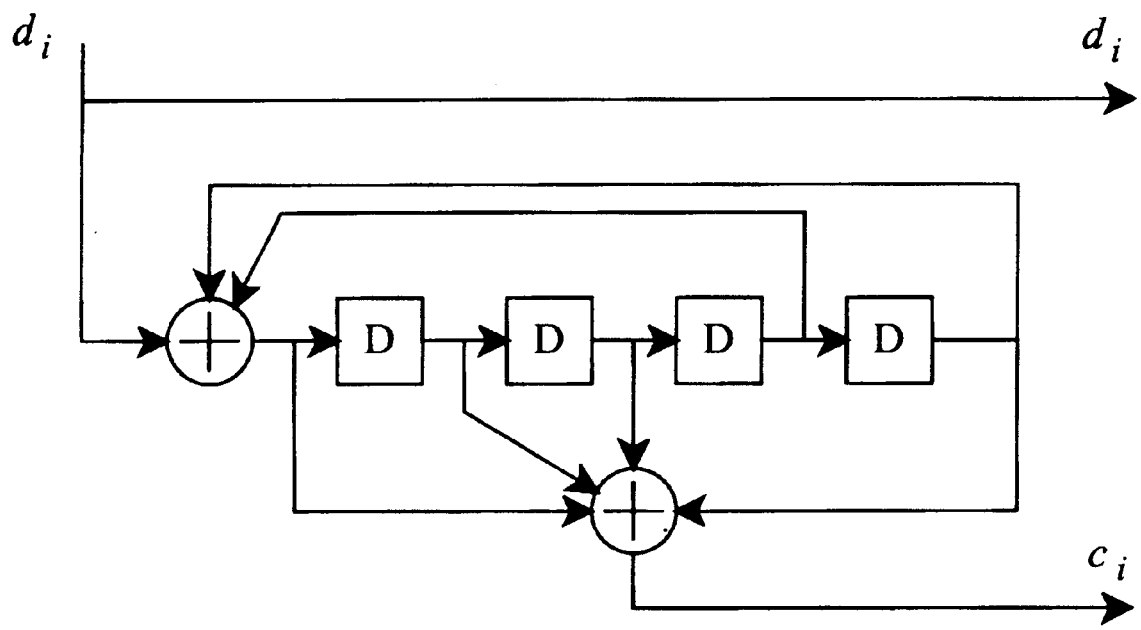
FIG. 2 illustrates, in a block diagram, an RSC encoder, with example polynomials (23,35) in base 8, according to prior art.

A number of embodiments for Turbo-code encoders and associated iterative Turbo decoders have been implemented on several general purpose DSP platforms. The associated Turbo-code encoder uses two 16-state, memory-4, RSC component encoders operating in parallel, as shown in FIG. 2. The following decoder throughput rates, in data kilobits per second (kbps), have been achieved with the modified Turbo decoder using 8 fixed max-log-APP decoding operations. The throughput for an Analog Devices 16-bit fixed-point ADSP-2181 processor running at 40 MIPS is about 17 kbps. A 40 MIPS Analog Devices SHARC processor has achieved a throughput of about 48 kbps. A 400 MHz Pentium-II processor with MMX has achieved over 400 kbps. With the early stopping technique the average throughput for the Pentium II easily exceeds 600 kbps, for most operating points of interest, while achieving the same performance as using 32 fixed max-log-APP decoding operations. Of course, numerous variations and adaptations may be made to the particular embodiments of the invention described above, without departing from the spirit and scope of the invention, which is defined in the claims.

What is claimed is:

1. A method of max-log-APP decoding of a sequence of samples representing a transmitted sequence of symbols obtained from encoding a data sequence of bits, each having a bit time i, with a binary convolutional encoding method having $N_s$ states and an encoding trellis, said decoding method comprising the steps of:

(a) receiving said sequence of samples;

(b) computing a set of branch metrics, at each time i, from the received sequence of samples;

(c) computing a set of $N_s$ forward state metrics, at each time i, from the set of branch metrics;

(d) computing a set of $N_s$ backward state metrics, at each time i, from the set of branch metrics;

(e) finding a maximum metric M for an MLSE sequence corresponding to the received sequence of samples;

(f) computing the maximum of all combined metrics at time i for at least one of the data bit values of 0 and 1, where a combined metric for a bit value at time i is the sum of a forward state metric, a branch metric, and a backward state metric, corresponding to a branch of the encoding trellis for said bit value at time i; and (g) computing at least one output log likelihood ratio, corresponding to the data bit at time i, as the difference between one of the maximum of all combined metrics for data bit values 0 and 1at time i and the maximum metric M.

2. A decoding method as in claim 1, wherein the convolutional encoding method uses recursive systematic convolutional (RSC) encoding.

3. A decoding method as in claim 1, wherein M is computed as the maximum of the last computed $N_s$ forward state metrics.

4. A decoding method as in claim 1, wherein M is computed as the maximum of the last computed $N_s$ backward state metrics.

5. A decoding method as in claim 1, wherein step (g) is performed such that if the maximum of all combined metrics at time i, for data bit 0, is less than the maximum metric M, then the output log likelihood ratio is calculated as the difference between the maximum of all combined metrics at time i, for data bit 0, and M, otherwise the output log likelihood ratio is calculated as the difference between the maximum metric M and the maximum of all combined metrics at time i, for data bit 1. such that if the maximum of all combined metrics at time i, for data bit 1, is less than the maximum metric M, then the output log likelihood ratio is calculated as the difference between the maximum metric M and the maximum of all combined metrics at time i, for data bit 1, otherwise the output log likelihood ratio is calculated as the difference between the maximum of all combined metrics at time i, for data bit 0, and M.

6. A decoding method as in claim 1, wherein step (g) is performed such that: if the maximum of all combined metrics at time i, for data bit 0, is less than the maximum metric M, then the output log likelihood ratio is calculated as the difference between the maximum of all combined metrics at time i, for data bit 0, and M, otherwise the output log likelihood ratio is calculated as the difference between the maximum metric M and the maximum of all combined metrics at time i, for data bit 1.

7. A decoding method as in claim 1, wherein the convolutional encoding method uses systematic convolutional encoding.

8. A decoding method as in claim 7 further using as an input, a set of systematic input log likelihood ratios, $L_{in}$, with an i-th element defined by $L_{in}(i)$, corresponding to the i-th data bit, wherein step (g) is performed such that:

if $L_{in}(i)<0$ and the maximum of all combined metrics at time i, for data bit 0, is less than M then the output log likelihood ratio is calculated as the difference between the maximum of all combined metrics at time i, for data bit 0, and M;

if $L_{in}(i)<0$ and the maximum of all combined metrics at time i, for data bit 0, is greater than or equal to M then the output log likelihood ratio is calculated as the difference between the maximum metric M and the maximum of all combined metrics at time i, for data bit 1;

if $L_{in}(i)\geq 0$ and the maximum of all combined metrics at time i, for data bit 1, is less than M then the output log likelihood ratio is calculated as the difference between the maximum metric M and the maximum of all combined metrics at time i, for data bit 1; and if $L_{in}(i)\geq 0$ and the maximum of all combined metrics at time i, for data bit 1, is greater than or equal to M then the output log likelihood ratio is calculated as the difference between the maximum of all combined metrics at time i, for data bit 0, and M.

9. A method of max-log-APP decoding of a sequence of samples representing a transmitted sequence of symbols obtained from encoding a data sequence of bits, each having a bit time i, with a binary convolutional encoding method having $N_s$ states and an encoding trellis, said decoding method comprising the steps of:

(a) receiving said sequence of samples;

(b) computing a set of branch metrics, at each time i, from the received sequence of samples;

(c) computing a set of $N_s$ forward state metrics, at each time i, from the set of branch metrics;

(d) computing a set of $N_s$ backward state metrics, at each time i, from the set of branch metrics;

(e) finding an MLSE sequence, corresponding to the received sequence of samples;

(f) finding a maximum metric M for the MLSE sequence;

(g) computing the maximum of all combined metrics at time i for one of the data bit values of 0 and 1, where a combined metric for a bit value at time i is the sum of a forward state metric, a branch metric, and a backward state metric, corresponding to a branch of the encoding trellis for said bit value at time i; and (h) computing one output log likelihood ratio, corresponding to the data bit at time i, as the difference between one of the maximum of all combined metrics for data bit values 0 and 1 at time i and the maximum metric M.

10. A decoding method as in claim 9, wherein the convolutional encoding method uses systematic convolutional encoding.

11. A decoding method as in claim 9, wherein the convolutional encoding method uses recursive systematic convolutional (RSC) encoding.

12. A decoding method as in claim 9, wherein M is computed as the maximum of the last computed $N_s$ forward state metrics.

13. A decoding method as in claim 9, wherein M is computed as the maximum of the last computed $N_s$ backward state metrics.

14. A decoding method as in claim 9, wherein step (h) is performed such that:

if the i-th bit of the MLSE sequence has a value of 1 then the output log likelihood ratio is calculated as the difference between the maximum of all combined metrics at time i, for data bit 0, and M, otherwise the output log likelihood ratio is calculated as the difference between the maximum metric M and the maximum of all combined metrics at time i, for data bit 1.

15. A decoding method as in claim 9, wherein steps (c) and (e) are combined to implement a step of computing a set of forward state metrics and an MLSE sequence using a Viterbi decoding method.

16. A decoding method as in claim 9, wherein steps (d) and (e) are combined to implement a step of computing a set of backward state metrics and an MLSE sequence using a Viterbi decoding method.

17. A method of max-log-APP decoding, as in claim 9, where the MLSE sequence is determined using one of the sets of forward and backward state metrics and a method of state metric retrace.

18. A method of iterative decoding of a sequence of samples representing a transmitted sequence of symbols obtained from encoding a data sequence of bits with a plurality of convolutional encoders, said decoding method comprising the steps of:

(a) receiving said sequence of samples; and (b) performing $N_{dec}$ decoding operations each corresponding to one of the convolutional encoders, where $N_{dec}$ is at least 3, wherein:

i) each of the first $N_{dec}-1$ decoding operations uses a method of soft-in/soft-out decoding, to provide a soft input for the next decoding operation;

ii) at least one of the first $N_{dec}-1$ decoding operations uses a method of log-APP decoding;

iii) the final $N_{dec}$-th decoding operation uses a method of MLSE decoding to determine an MLSE sequence; and iv) at least two of the $N_{dec}$ decoding operations correspond to the same convolutional encoder.

19. An iterative decoding method as in claim 18, wherein the method of log-APP decoding includes max-log-APP decoding.

20. An iterative decoding method as in claim 18, wherein the final decoding operation uses a Viterbi decoding method to determine the MLSE sequence.

21. An iterative decoding method as in claim 18, wherein the final decoding operation computes state metrics and uses a method of state metric retrace to determine the MLSE sequence.

22. An iterative decoding method as in claim 18, wherein the final decoding operation uses a method of max-log-APP decoding with an extrinsic information scale factor of one to determine the MLSE sequence.

23. A method of iterative decoding of a sequence of samples representing a transmitted sequence of symbols obtained from encoding a data sequence of bits with a plurality of convolutional encoders, said decoding method comprising the steps of:

(a) receiving said sequence of samples; and (b) performing $N_{dec}$ decoding operations each corresponding to one of the convolutional encoders, where $N_{dec}$ is at least 2, wherein:

i) each of the first $N_{dec}-1$ decoding operations uses a method of soft-in/soft-out decoding, to provide a soft input for the next decoding operation, where at least one of the first $N_{dec}-1$ decoding operations computes a set of $N_s$ forward state metrics and a set of $N_s$ backward state metrics, at each time i, from a set of branch metrics computed from a sequence of samples from the output of the previous decoding operation;

finds a maximum metric M for an MLSE sequence corresponding to the sequence of samples from the output of the previous decoding operation;

computes the maximum of all combined metrics at time i for at least one of the data bit values of 0 and 1, where a combined metric for a bit value at time i is the sum of one of the set of $N_s$ forward state metrics, a branch metric from the set of branch metrics, and one of the set of $N_s$ backward state metrics, corresponding to a branch of the encoding trellis for said bit value at time i; and computes at least one output log likelihood ratio, corresponding to the data bit at time i, as the difference between one of the maximum of all combined metrics for data bit values 0 and 1 at time i and the maximum metric M; and ii) the final $N_{dec}^{th}$ decoding operation uses a method of MLSE decoding to determine an MLSE sequence.

24. A method of iterative decoding of a sequence of samples representing a transmitted sequence of symbols obtained from encoding a data sequence of bits with a plurality of convolutional encoders, said decoding method comprising the steps of:

(a) receiving said sequence of samples; and (b) performing $N_{dec}$ decoding operations each corresponding to one of the convolutional encoders, where $N_{dec}$ is at least 2, wherein:

i) each of the first $N_{dec}-1$ decoding operations uses a method of soft-in/soft-out decoding, to provide a soft input for the next decoding operation, where at least one of the first $N_{dec}-1$ decoding operations computes a set of $N_s$ forward state metrics and a set of $N_s$ backward state metrics, at each time i, from a set of branch metrics computed from a sequence of samples from the output of the previous decoding operation; finds an MLSE sequence, corresponding to the sequence of samples from the output of the previous decoding operation; finds a maximum metric M for an MLSE sequence corresponding to the sequence of samples from the output of the previous decoding operation; computes the maximum of all combined metrics at time i for one of the data bit values of 0 and 1, where a combined metric for a bit value at time i is the sum of one of the set of $N_s$ forward state metrics, a branch metric from the set of branch metrics, and one of the set of $N_s$ backward state metrics, corresponding to a branch of the encoding trellis for said bit value at time i; and computes at least one output log likelihood ratio, corresponding to the data bit at time i, as the difference between one of the maximum of all combined metrics for data bit values 0 and 1 at time i and the maximum metric M; and ii) the final $N_{dec}^{th}$ decoding operation uses a method of MLSE decoding to determine an MLSE sequence.

25. A method of iterative decoding of a sequence of samples representing a transmitted sequence of symbols obtained from encoding a data sequence of bits with a plurality of systematic convolutional encoders, said decoding method comprising the steps of:

(a) receiving said sequence of samples;

(b) specifying a maximum number $D_{max}$ of decoding operations, where $D_{max}$ is at least 2, and each decoding operation corresponds to one of the systematic convolutional encoders;

(c) specifying a minimum number $D_{min}$ of decoding operations, where $D_{min}$ is at least 1;

(d) specifying a preferred number $D_{ag}$ of consecutive agreements, between two consecutive MLSE sequences, where $D_{ag}$ is at least 1;

(e) counting the number of decoding operations performed as $N_{dec}$;

(f) testing if $N_{dec}$ is equal to $D_{max}$ and stopping the iterative decoding method when true;

(g) counting the number of consecutive agreements, $N_{ag}$, between two consecutive MLSE sequences; and (h) testing if $N_{ag}$ is equal to $D_{ag}$ and stopping the iterative decoding method when true;

wherein:

i) each of the first $N_{dec}-1$ decoding operations uses a method of soft-in/soft-out decoding;

ii) each decoding operation from $D_{min}-D_{ag}$ to $N_{dec}-1$ uses a first method of MLSE decoding to find an MLSE sequence;

iii) the final $N_{dec}$-th decoding operation uses a second method of MLSE decoding to find a final MLSE sequence; and iv) if $D_{min}-D_{ag}=0$ then the 0-th MLSE sequence is determined from a systematic portion of the received sequence of samples independent of any decoding operations.

26. An iterative decoding method as in claim 18, wherein the soft-in/soft-out decoding method uses a method of log-APP decoding.

27. An iterative decoding method as in claim 18, wherein the soft-in/soft-out decoding method uses a method of max-log-APP decoding.

28. An iterative decoding method as in claim 25 wherein the second method of MLSE decoding uses a Viterbi decoding method to determine the final MLSE sequence.

29. An iterative decoding method as in claim 25, wherein the second method of MLSE decoding computes state metrics and uses a method of state metric retrace to determine the final MLSE sequence.

30. An iterative decoding method as in claim 18 wherein the second method of MLSE decoding uses a method of max-log-APP decoding with an extrinsic information scale factor of one to determine the final MLSE sequence.

31. The method of iterative decoding of claim 25, further comprising the step of specifying a maximum number of iterative decoding repetitions, $I_{max}$, where $I_{max}$ is at least 1 prior to receiving said sequence of samples, and following step (h), the steps of counting the number of iterative decoding repetitions performed as $N_{it}$; and performing a test if $N_{dec}$ is equal to $D_{max}$ and if $N_{ag}$ is less than $D_{ag}$ and if $N_{it}$ is less than $I_{max}$; such that if the test is true, then a further repetition is performed wherein a sequence of decoding operations is different from a corresponding sequence of decoding operations used in all previous repetitions of iterative decoding.

32. A method of iterative decoding of a sequence of samples representing a transmitted sequence of symbols obtained from encoding a data sequence of bits with a plurality of convolutional encoders, said decoding method comprising the steps of:
(a) receiving said sequence of samples; and
(b) performing $N_{dec}$ decoding operations each corresponding to one of the convolutional encoders, where $N_{dec}$ is at least 2, wherein:
  i) $N_{dec}$ equals $N_1+N_2$, where $N_1$ is a number of first decoding operations and is at least 1, and $N_2$ is a number of second decoding operations and is at least 1;
  ii) each of the $N_1$ first decoding operations uses a method of log-APP decoding; and
  iii) each of the $N_2$ second decoding operations uses a method of max-log-APP decoding.

33. An iterative decoding method as in claim 32, including a method of early stopping based on comparing consecutive MLSE sequences where each MLSE sequence corresponds to one of the decoding operations.

34. A method of iterative decoding of a sequence of samples representing a transmitted sequence of symbols obtained from encoding a data sequence of bits with a plurality of convolutional encoders, said decoding method comprising the steps of:
(a) receiving said sequence of samples; and
(b) performing $N_{dec}$ decoding operations each corresponding to one of the convolutional encoders, where $N_{dec}$ is at least 3, wherein:
  i) $N_{dec}$ equals $N_1+N_2+1$, where $N_1$ is a number of first decoding operations and is at least 1, $N_2$ is a number of second decoding operations and is at least 1, and there is a single third decoding operation;
  ii) each of the $N_1$ first decoding operations uses a method of log-APP decoding;
  iii) each of the $N_2$ second decoding operations uses a method of max-log-APP decoding; and
  iv) the single third decoding operation uses a method of MLSE decoding.

35. An iterative decoding method as in claim 34, including a method of early stopping based on comparing consecutive MLSE sequences where each MLSE sequence corresponds to one of the decoding operations.

* * * * *

UNITED STATES PATENT AND TRADEMARK OFFICE
CERTIFICATE OF CORRECTION

PATENT NO.     : 6,510,536 B1
DATED          : January 21, 2003
INVENTOR(S)    : Stewart N. Crozier et al.

It is certified that error appears in the above-identified patent and that said Letters Patent is hereby corrected as shown below:

Column 1,
Line 50, replace "posterior" with -- posteriori --
Line 52, replace "posterior" with -- posteriori --

Column 12,
Line 23, replace "off" with -- of --

Column 17,
Line 47, replace "1is" with -- 1 is --

Signed and Sealed this

Eighth Day of July, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,510,536 B1
DATED         : January 21, 2003
INVENTOR(S)   : Crozier et al.

It is certified that error appears in the above-identified patent and that said Letters Patent is hereby corrected as shown below:

Column 1,
Line 50, delete "a posterior" and insert therefor -- a posteriori --.
Line 52, delete "a posterior" should read therefor -- a posteriori --.

Column 21,
Lines 8-16, delete "such that if the maximum of all combined metrics at time i, for data bit 0, is less than the maximum metric M, then the output log likelihood ratio is calculated as the difference between the maximum of all combined metrics at time i, for data bit 0, and M, otherwise the output log likelihood ratio is calculated as the difference between the maximum metric M and the maximum of all combined metrics at time i, for data bit 1."

Column 25,
Line 8, delete "18" and insert therefor -- 25 --.

Signed and Sealed this

Fourth Day of November, 2003

JAMES E. ROGAN
*Director of the United States Patent and Trademark Office*